United States Patent [19]

Hyatt

[11] 4,121,284
[45] Oct. 17, 1978

[54] COMPUTERIZED SYSTEM FOR OPERATOR INTERACTION

[76] Inventor: Gilbert P. Hyatt, 11101 Amigo Ave., Northridge, Calif. 91324

[21] Appl. No.: 288,247

[22] Filed: Sep. 11, 1972

[51] Int. Cl.² .................. G06F 3/02; G06F 11/00; G06F 7/00; G08C 1/00

[52] U.S. Cl. .................. 364/200; 340/365 E; 364/709

[58] Field of Search .......... 340/172.5, 324 M, 324 R, 340/334, 336, 365 E, 146.1 AB; 235/156, 145 R; 364/200 MS File, 900 MS File, 709, 737; 178/17 C

[56] References Cited

U.S. PATENT DOCUMENTS

| | | | |
|---|---|---|---|
| 3,346,853 | 10/1967 | Koster | 364/900 |
| 3,380,031 | 4/1968 | Clayton et al. | 340/172.5 |
| 3,389,404 | 6/1968 | Koster | 364/900 |
| 3,533,078 | 10/1970 | Perkins | 364/200 |
| 3,564,509 | 2/1971 | Perkins et al. | 340/172.5 |
| 3,566,358 | 2/1971 | Hasbrouck | 340/172.5 |
| 3,573,749 | 4/1971 | Smith et al. | 340/172.5 |
| 3,587,085 | 6/1971 | Baxter | 340/324 |
| 3,588,834 | 6/1971 | Pedersen et al. | 340/172.5 |
| 3,593,299 | 7/1971 | Discoll et al. | 340/172.5 |
| 3,623,011 | 11/1971 | Baynard, Jr. et al. | 340/172.5 |
| 3,631,403 | 12/1971 | Asbo et al. | 340/172.5 |
| 3,641,329 | 2/1972 | DeSandre et al. | 340/172.5 X |
| 3,641,505 | 2/1972 | Artz et al. | 340/172.5 |
| 3,641,558 | 2/1972 | Cook et al. | 340/172.5 X |
| 3,648,252 | 3/1972 | Thron et al. | 340/172.5 |
| 3,653,001 | 3/1972 | Ninke | 340/172.5 |
| 3,665,421 | 5/1972 | Rehhausser et al. | 340/172.5 |
| 3,668,653 | 6/1972 | Fair et al. | 340/172.5 |
| 3,675,239 | 7/1972 | Ackerman | 340/365 E |
| 3,676,656 | 7/1972 | Schmidt | 235/156 |
| 3,686,637 | 8/1972 | Zachar | 364/200 |
| 3,702,462 | 11/1972 | England | 340/172.5 |
| 3,702,988 | 11/1972 | Haney et al. | 340/172.5 |
| 3,748,452 | 7/1973 | Ruben | 340/172.5 |
| 3,757,308 | 9/1973 | Fosdick | 340/172.5 |
| 3,760,171 | 9/1973 | Wang et al. | 340/172.5 X |
| 3,932,838 | 1/1976 | Sitter | 364/900 |

*Primary Examiner*—James D. Thomas
*Attorney, Agent, or Firm*—Gilbert P. Hyatt

[57] ABSTRACT

A system is provided for operator interaction having a computer for enhanced operation. The computer performs switch debounce operations under program control and performs display refresh operations under program control. The computer is a fully integrated circuit computer in a preferred embodiment having an integrated circuit read only memory for storing a program and an integrated circuit scratchpad memory for storing operands.

38 Claims, 15 Drawing Figures

FIG—9

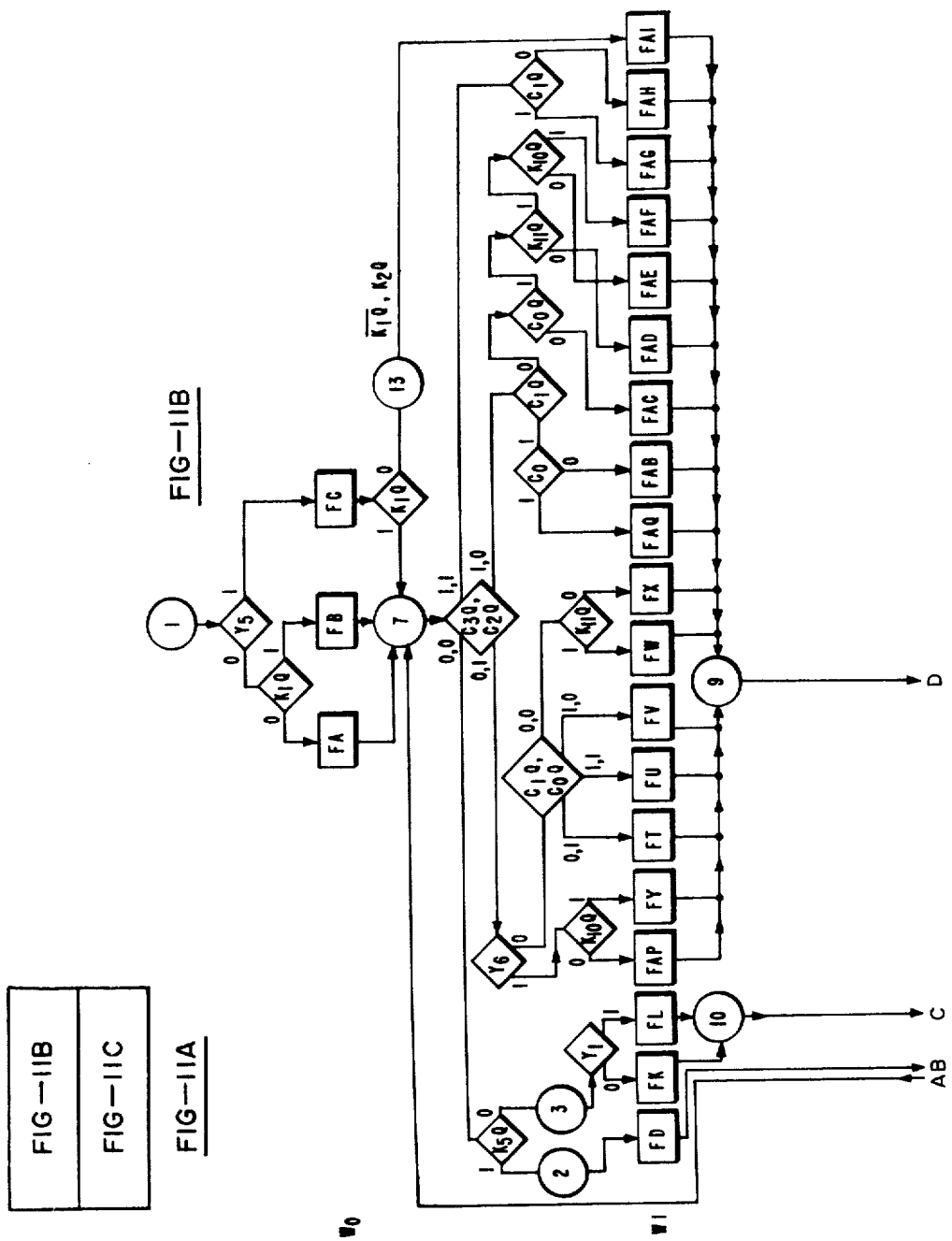

COMPUTERIZED SYSTEM FOR OPERATOR INTERACTION

CROSS REFERENCE TO RELATED APPLICATIONS

This application is a continuation in part of copending application Factored Data Processing System For Dedicated application Ser. No. 101,881 filed on Dec. 28, 1970 by Gilbert P. Hyatt; wherein the benefit of the filing date thereof is herein claimed in accordance with the U.S. Code such as with 35 USC 120 and 35 USC 121; wherein this application is further related to copending applications.

(1) Computerized Numerical Control System For Parts Program Checkout, Editing and Execution Ser. No. 230,872 filed on Mar. 1, 1972 by Gilbert P. Hyatt;

(2) Data Processing System Having A Stored Program Computer Dedicated To The Numerical Control Of A Machine Ser. No. 232,459 filed on Mar. 7, 1972 by Gilbert P. Hyatt; and (3) Interactive Control System Ser. No. 101,449 filed on Dec. 28, 1970 by Barry T. Lee, Ralph V. Cole, Irving Hirsch, Gilbert P. Hyatt, and Gunther W. Wimmer now abandoned in favor of continuing Application Interactive Control System Ser. No. 354, 590 filed on Apr. 24, 1973 by Barry T. Lee, Ralph V. Cole, Irving Hirsch, Gilbert P. Hyatt and Gunther W. Wimmer now U.S. Pat. No. 4,038,640 issued on July 26, 1977 wherein the above listed related patent applications are incorporated herein by reference as if fully set forth at length herein.

The relationship of the above-referenced patent applications will become apparent to those skilled in the art from the disclosures therein and the disclosures herein and the wealth of prior art knowledge. For example, said above-referenced patent applications are all directed to features of substantially the same system as it was expanded to disclose additional capabilities.

In order to facilitate by-reference of material from the above-listed unissued patent applications, authorization is hereby given to open the file to the public of the above-listed unissued patent applications for the limited purpose set forth below. The files of said unissued applications Ser. No. 101,881; Ser. No. 879,293; Ser. No. 230,872; Ser. No. 232,459; and Ser. No. 101,449 are hereby opened to the public for the limited purpose of implementing incorporation-by-reference wherein the portions of the files of said unissued applications that do not relate to the disclosure as-filed such as argument, Actions, amendments, etc should not be opened to the public except as may be determined by the Patent Office to be required to facilitate the doctrine of incorporation-by-reference.

BACKGROUND OF THE INVENTION

1. Field of the Invention

This invention relates to electronic data processing systems and more particularly to very low cost business data processing systems.

2. Description of the Prior Art

Digital computers have been widely used for complex computational and processing applications but have only started to be used in the less sophistocated business and industrial applications and have not been used in consumer type applications. High cost and complexity of computer systems are two of the main reasons for these limitations in computer applications. A computer is not a useful device by itself because it must be contained in a system with input and output devices in order to interact with the outside environment. Unnecessary complexity has resulted in the prior art both, in configuring the computer and in configuring the system. This complexity has resulted in high costs and other effects of complexity. A comprehensive discussion of the prior art is presented to illustrate the reason for this prior art computer system complexity to provide a basis for discussing this invention.

Computers are basically numerical computation devices and, before they can be useful, it is necessary to provide a suitable mechanism to supply input digital data to the computer upon which computations are to be performed in response to the computer's stored program and also to provide suitable output mechanisms for removing the computer digital data from the computer system known to those skilled in the art as peripheral equipment. Typically, such peripheral subsystems are self-contained, stand-alone devices which operate "off-line" from the computer and which are physically and operationally separate and identifiable from the actual data processing subsystem within the computer system. A typical input peripheral subsystem might be a punched tape reader, a control panel, a high speed punched card reader, a magnetic tape reader, a typewriter or the like. A typical output peripheral subsystem might be a typewriter, a high-speed line printer, a visual display device such as a cathode ray tube or an array of alpha numeric tubes or some form of servo system which enables the computer to control some physical or mechanical device.

In the prior art, the actual data processor subsystem and the peripheral subsystem have usually been designed separately in the belief that this enabled each to perform its particular function in the system in an optimum manner. Each subsystem is designed to operate in its own particular signal format which is usually intrinsic to that particular subsystem. For example, the actual data processor or central computer in the system is usually designed to operate from whole words, each consisting of many bits in parallel, and to perform the computations within the data processor subsystem at the extremely high rates of speed which pure electronic devices can achieve. In contrast to this, most peripheral subsystems include moving mechanical components which limit their rates of speed to much lower rates, usually several orders of magnitude lower than the speed of purely electronic data processing subsystems. In addition, depending upon its physical nature, each particular peripheral subsystem usually dictates a particular signal format in which it operates. For example, an input peripheral subsystem such as a punched tape reader or a typewriter supplies sequential information in a particular format and at rates largely determined by the mechanical characteristics of the input peripheral subsystem. Output peripheral subsystems such as typewriters, high speed line printers, servo systems or the like in turn require that control signals having particular formats adapted to the particular output peripheral subsystem be applied to the peripheral subsystem in order that the subsystem perform its function in the system in an optimum manner.

Since the central data processor subsystem operates in its signal format and each of its input and output peripherals operates in its own signal format which is practically always different from the signal format of the central data processor, some means must be provided to translate between these various signal formats in order that the peripheral subsystems can provide their intended function of providing input signals to the computer and extracting the output signals from the computer. The usual prior art way of effecting this translation is to provide a separate interface unit between each peripheral subsystem and the central data processor subsystem. The necessity of these interface units was not questioned in the prior art. Indeed, it was generally considered that, in addition to the necessary signal translating function, they performed many other useful functions in the system which resulted in an overall simpler and more useful computer system. For example, the interface units served to "buffer" the peripheral subsystem from the central data processor unit to synchronize the operation of the central data processor subsystem and the peripheral subsystem.

Computer designers assigned peripheral tasks to the special purpose interface units between the peripheral subsystems and the central data processor subsystem in order that input data would be available to the central data processor subsystem in its own desired format at whatever times it desired this information, and that the interface units for the output peripheral subsystems might receive output signals from the computer at the computer's own convenience and in the computer signal format. These interface units usually included many special purpose logic circuits or devices which were unique to the particular peripheral subsystem associated with that interface unit.

For example, input peripheral subsystems of the type described above develop rudimentary input signals in their own signal format which might include time-ambiguous information. Such rudimentary input signals are customarily preprocessed in the interface unit associated with the peripheral subsystem to provide a signal in central data processor format. Thus, those skilled in the art have not considered the interface units to be merely a necessary evil which must be interposed between the peripheral subsystem and the central data processor subsystem. Instead, such units have been considered to have many positive virtues which enable the overall computer system to perform its overall function in the only feasible manner.

These interface units performed what might be called the communication function of the system. This communication function between the central data processor subsystem and the peripheral subsystems and between the system and the "outside world" is largely controlled and performed by these interface units. These communication functions are performed without reference to the data processor's stored program, in an off-line manner. The data processor is thus left to do only its "intended task" of performing computations under control of its stored program, or of performing the computation function in the system.

Because of the high cost of designing and manufacturing an electronic computer, computers have traditionally been designed to perform a large variety of data processing functions where interfaced peripheral equipment is therefore arranged to permit maximum use of computer time. The interfacing provides signal conditioning, synchronization to the selected intrinsic time base, and transfer of command and data signals. Thus, electronic data processors have been organized on an essentially modular basis, with processor, storage, housekeeping and peripheral modules all committed to a particular machine language, timing and intercommunication format.

Also, electronic data processing systems may be implemented with integrated circuits, but such systems are not fully integrated circuit or monolithic systems because of requirements for variable as well as constant data storage and, therefore, use core or other similar types of storage.

Although a dedicated computer may be a general purpose machine of a standard commercial type, substantial peripheral and interface equipment is very often required. For example, completely different control panels may be required for similar but different applications, which entails the usage of a unique hardwired interface for each control panel in order to make it operate in conjunction with the system. The so-called mini-computers now in widespread use are relatively low in cost compared to earlier systems but costs of interfacing and peripheral equipment are often considerably in excess of the cost of a mini-computer itself.

Because of the resultant high cost of general purpose computer systems, most systems have been implemented with special purpose logic rather than with general purpose computers. These systems inherently lack the versatility of systems incorporating general purpose computers. Consequently, in order to incorporate new features or to extend their system versatility even within a particular application, they must either be significantly redesigned or new subsystems must be added along with substantial interface devices. Thus, a special purpose system that does not initially provide a certain capability may require substantial special purpose circuitry added to the system to incorporate such a capability. On the other hand, where a stored program data processor is used in the prior art with conventional interfacing to input-output systems, computational and memory capacity may be only partially utilized. However, any change of system orientation, such as change or addition of an item of peripheral equipment, still requires conventional interfacing to be added.

This above consideration is characterized by operator panels. In prior art systems, panels are typically an array of panel-mounted components, including switches and lamps, interconnected with discrete wiring and cabling, and routed to electronic circuit boards. Interlocking and control functions are hardwired directly on the panel. These switches and lamps are often directly connected to various parts of the system through special purpose logic to control and monitor hardwired functions. Prior art control panels generally have large bundles of interconnecting cabling resulting in degraded reliability and poor economy coupled with hardwired functions that can only be changed by rewiring and restructuring the system physically, yielding little if any degree of versatility.

SUMMARY OF THE INVENTION

The present invention provides an improved and simplified electronic data processing system which performs the necessary data processing functions at least as well as prior art systems but which, because of its simplicity and low cost, is suitable for use in applications where, because of economic reasons, the benefits of electronic data processing systems were previously unavailable. In particular, this invention presents a simple, inexpensive system and method to provide computerized capability for business applications. It should be understood that any reference to such a business system is intended to include any system wherein digital data processing capability is provided. The particular system discussed herein is one class of such devices.

The preferred embodiment of this invention is a class of advanced low cost business systems containing a general-purpose (stored program) digital data processor for high levels of capability and versatility. A computerized business system can be provided at each work station for versatility and economy, where this system is cost competitive with prior art noncomputerized systems. This system operates in conjunction with the operator in real time to provide self-contained data processing capability, where one computer per work station is provided, "dedicated" to the individual operator on a stand-alone basis. Major assemblies in this system include a general purpose digital computer and can include an operator panel, memory, CRT display, typewriter, tape reader, power supply, and other equipment. The factored computer system of this invention includes a computer integrated into the system for versatility, economy, and performance. For example, the control panel is integrated into the system as an extension of the computer I/O section. This I/O section is physically partitioned so that many of the interface functions normally performed in a computer I/O are physically contained on the panel motherboard. This system operates under program control; where display, data processing, control, and other such functions are handled under program control by the computer. The executive routine permits time-share operation and self-contained diagnostics. Therefore, the system can be conveniently upgraded to incorporate additional features, primarily by reprogramming the computer.

In accordance with one of the features of the present invention it is recognized that in many computer applications such as the above-described dedicated computer system, because of the high speed at which the central data processor subsystem performs its computations, only a fraction of the computer's time is required to perform the computational functions. With the system architecture of this invention, the above-described interface unit can be eliminated and the central data processor subsystem can perform the functions previously performed by the interface units under control of its stored program during those portions of its operating cycle which are not required for the primary computational task. Thus, the central data processor subsystem performs not only the computational task, but also communication tasks and various control tasks associated with the peripheral and interface units.

In accordance with this feature of the present invention, an electronic data processing system is provided which includes a plurality of subsystems, one of which is a stored program data processor subsystem which performs computations in response to its stored program in a first signal format which is intrinsic to the data processor. At least one additional peripheral subsystem, such as an input or output peripheral subsystem, is provided which utilizes time-varying signals in a second signal format different from the first signal format of the data processor. The data processor, in response to its stored program, communicates on a real time basis with the peripheral subsystem in the second or peripheral subsystem signal format and performs any necessary conversions or preprocessing of rudimentary signals received from the peripheral subsystem prior to the performance of the primary computational task with respect to the data contained in those rudimentary signals, all under control of the stored program.

The term "real time" should be defined since it is sometimes used or misused in the computer art to have a number of different meanings. As used in this application, a data processing system is said to be operating on a real time basis when time of occurance of the computer operations in the data processing subsystem is dictated by the requirements of the peripheral subsystem or the external devices, rather than by the data processor operations.

As discussed herein, one of the characteristics of a dedicated computer is that, during its entire lifetime, it performs only a single set of tasks or functions in response to its stored program. Thus, there is usually no need to change the program once it is stored in the memory of the computer. In accordance with yet another feature of the present invention, a computer system of the general purpose type described is provided which includes two separate and independent memory portions. The first memory is a monolithic read only memory in which the desired program is permanently written and stored at the time this memory is made. In the preferred embodiment, this memory is a large-scale integrated circuit unit in which the desired program is "written" at the time the integrated circuit is manufactured by providing an appropriate mask in the manufacturing process to store the appropriate one of the two possible binary digits in each of the memory cells in the array. Other embodiments and the manner of making them will be obvious to those skilled in the integrated circuit art. This program stored in the monolithic read only memory is the program which controls the dedicated computer. A second independent memory unit is provided which is independently addressable and controllable by the data processor subsystem, which is an electrically alterable memory. This second memory may be termed the intermediate memory or a "scratch pad" memory. Preferably, this memory is also an array of memory cells on a monolithic integrated circuit chip, but is one which can be electrically altered by the data processor subsystem. This scratch pad memory is used to store operands which might be generated and used during the computational process by the computer and which need to be stored for subsequent retrieval for future use by the data processor subsystem. This two memory arrangement has been found to be particularly applicable to dedicated computers. By placing the stored program in a read only memory, it is stored in non-volatile form and cannot be changed or destroyed either by power failure, error by the machine operator or the like. The electrically alterable scratch pad memory provides the necessary intermediate storage during operation of the system. If the information in this memory is for any reason destroyed or damaged by power failure, operator error or the like, no permanent damage is rendered since the stored program is still available in the read only memory and the information in the scratch pad memory can easily be regenerated by the system.

An object of this invention is to provide a practical computerized business system.

A further object of this invention is to provide a very low cost computerized business system.

A further object of this invention is to reduce the dependence of the business system on a remote large scale computer system.

A further object of this invention is to provide a practical, low cost payroll data processing system.

A further object of this invention is to provide a practical, low cost computerized calculator system.

A further object of this invention is to provide an efficient means and method for a data processor interfacing with a keyboard.

A further object of this invention is to provide an efficient means and method for a data processor interfacing with a typewriter.

Still a further object of this invention is to provide an efficient method for a data processor interacting with an operator.

The forgoing and other objects, features, and advantages of this invention will be apparent from the following detailed description of preferred embodiments of this invention, as illustrated in the accompaning drawings.

BRIEF DESCRIPTION OF THE DRAWINGS

A better understanding of the invention may be had from a consideration of the following detailed description, taken in conjunction with the drawings, in which:

FIG. 1 comprises FIGS. 1A and 1B wherein

FIG. 5 is a data processor program flow diagram illustrating numeric display operations.

FIG. 6 is a data processor program flow diagram illustrating switch control operations.

FIG. 11 is a data processor micro-operation flow diagram comprising FIGS. 11B and 11C illustrating the data processor instruction execution paths and FIG. 11A illustrating how FIGS. 11B and 11C are connected.

DETAILED DESCRIPTION OF THE INVENTION

General Discussion

Figure 1A:
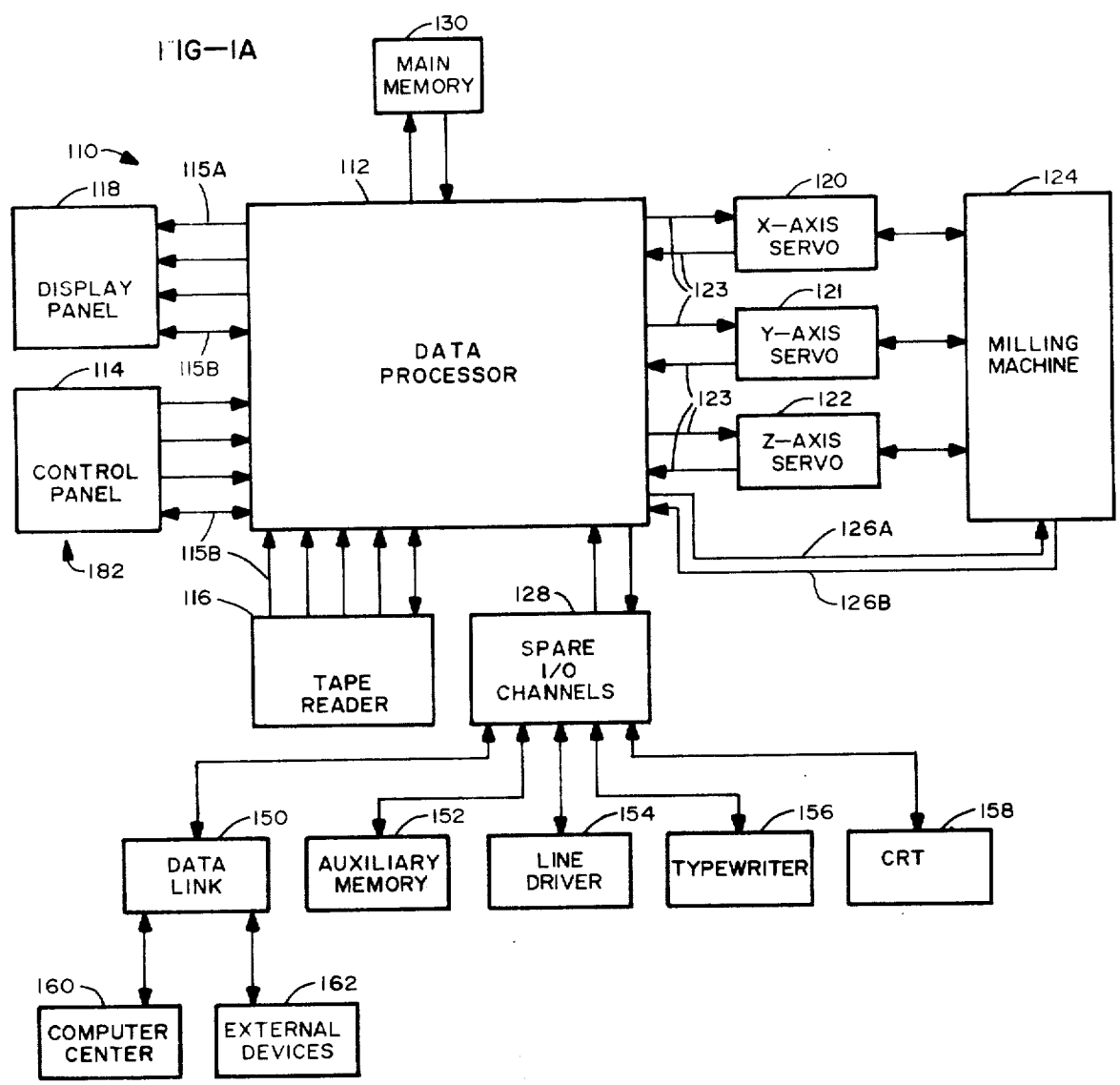
FIG. 1A is a block diagram of the system and FIG. 1B is a block diagram of a stored program data processor in accordance with the present invention.

The business data processing system of this invention can take any of a number of possible forms. A preferred embodiment of the present invention is shown in FIG. 1A and will be described in detail hereafter.

By way of introduction of the illustrated embodiment, the components shown in FIGS. 1 through 11 of the drawings have been assigned general reference numerals and a brief description of such components is given in the following description. The components in each figure have in general been assigned three or four digit reference numerals wherein the hundreds digits or digits of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral.

This application is a continuation in part of the previously referenced parent application Ser. No. 101,881 and relates more specifically to the business data processing capability which may be achieved by applying the general teachings of said parent application to the specific context of a business data processing system.

As shown in FIG. 1A, a data processing system 110 includes a data processor subsystem 112; a plurality of input and output peripheral subsystems including control panel 114, tape reader 116, display panel 118, servo axes 120-123, and I/O channels 126, 128 through which input information is supplied to the data processor 112 and from which the output signals from data processor 112 are applied to output devices which the system 110 is controlling; and a main memory 130 in which the stored program of the data processor 112 is located. As is described in detail hereafter, this stored program is used to control not only the computational processes in data processor 112, but also the communication in the system 110 between the data processor 112 and the various other subsystems.

Since the data processing system 110 has been shown as a numerical control system for controlling a milling machine 124, input and output peripheral subsystems have been described which are suitable to perform this desired control function in the previously referenced parent application Ser. No. 101,881. However, those skilled in the art will readily recognize that the numerical control system is merely illustrative of the present invention and the principles of the invention are equally applicable to other systems such as the business systems described herein in which different forms of input and output peripheral subsystems might be used to perform the particular task of such other systems.

Figure 2:
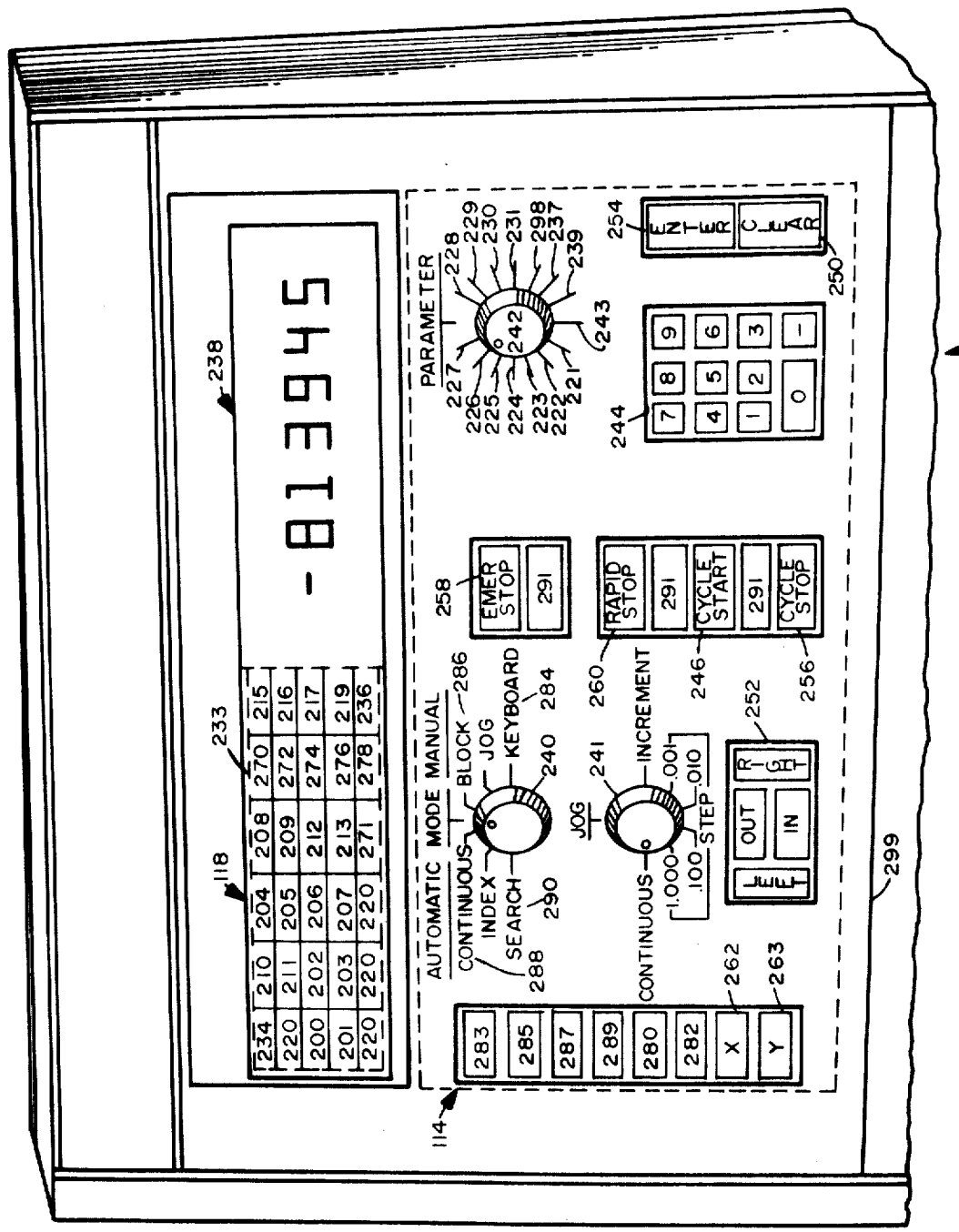
FIG. 2 is a diagram of the control panel and display panel.

Commands and displays may be provided with the control panel 114 and the display panel 118 using switches and displays and illustrated in FIG. 2 using spare switches and displays described in the previously referenced applications Ser. No. 101,881 and Ser. No. 101,449. Still further capability is provided with the auxiliary input/output channels 128 described in the previously referenced parent application Ser. No. 101,881. These auxiliary input/output channels 128 provide access to alternate elemental extremities and peripherals as is discussed in greater detail hereafter.

Figure 1B:
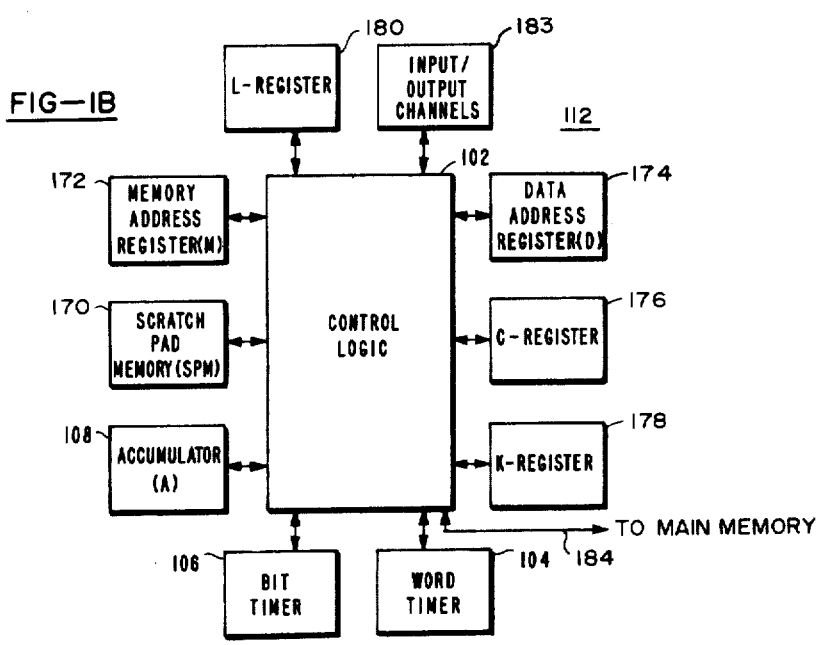
Figure 4:
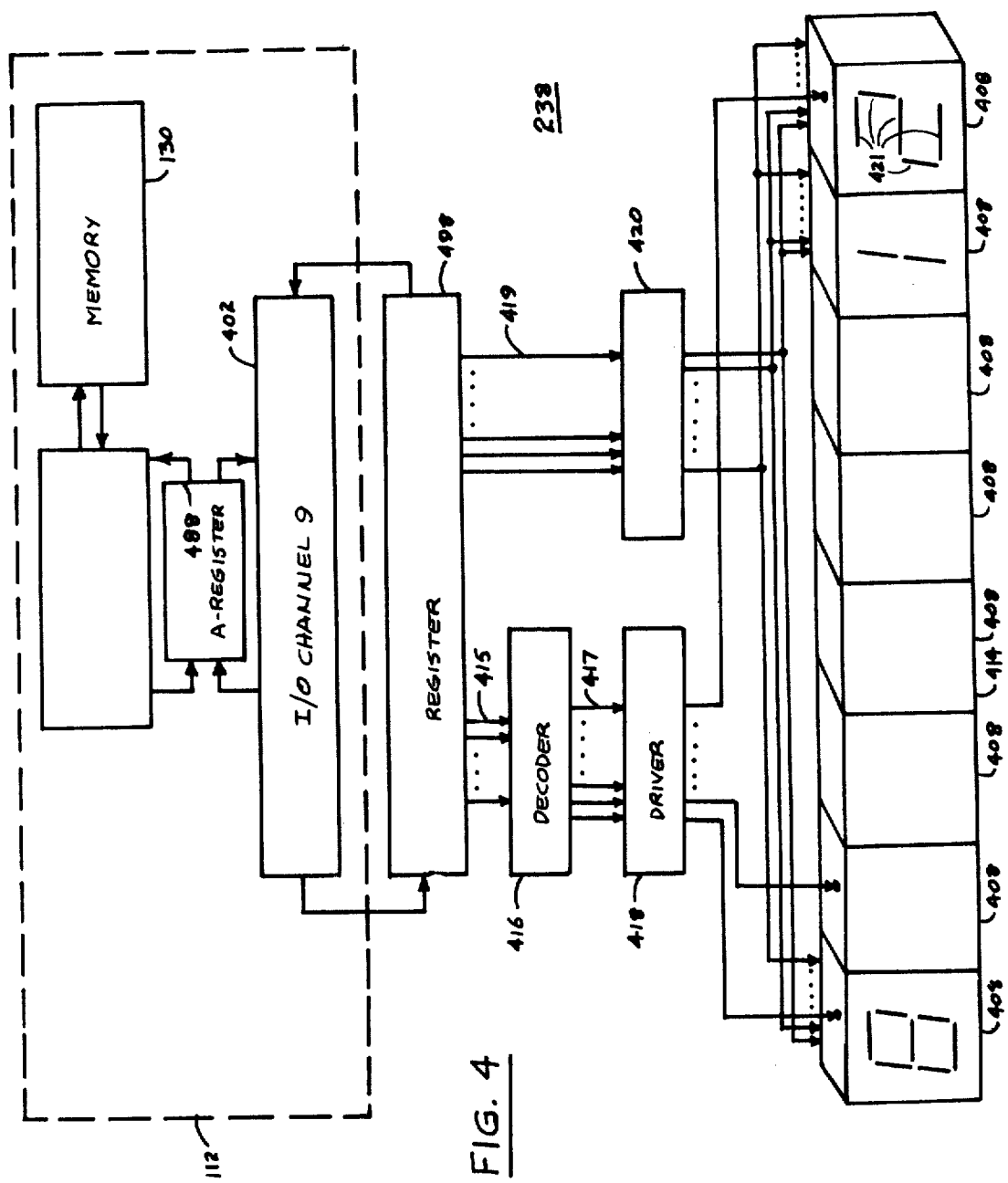
FIG. 4 is a block diagram of the numeric display.
Figure 8:
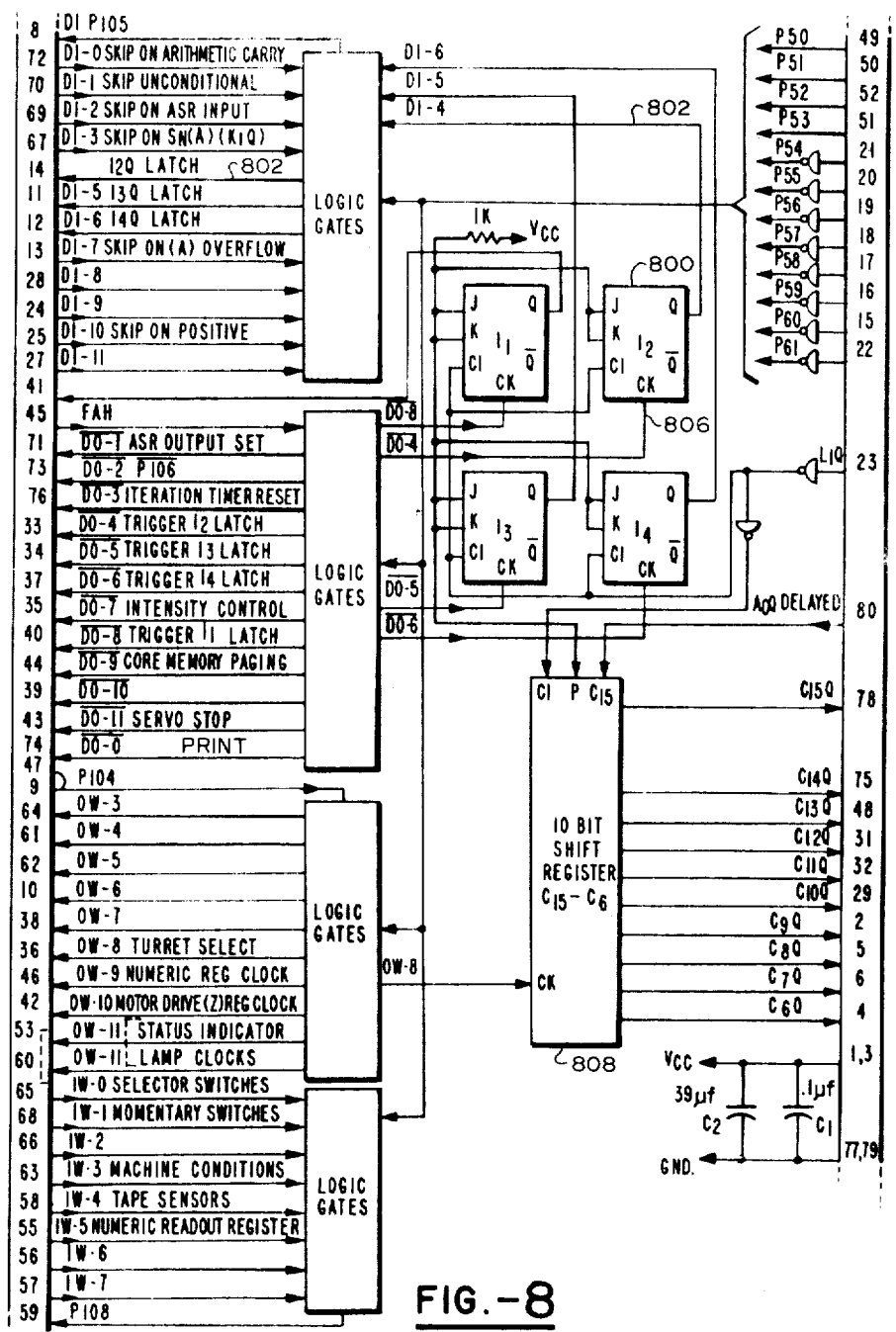
FIG. 8 is a schematic and block diagram representation of the IFA-1 circuit board.
Figure 9:
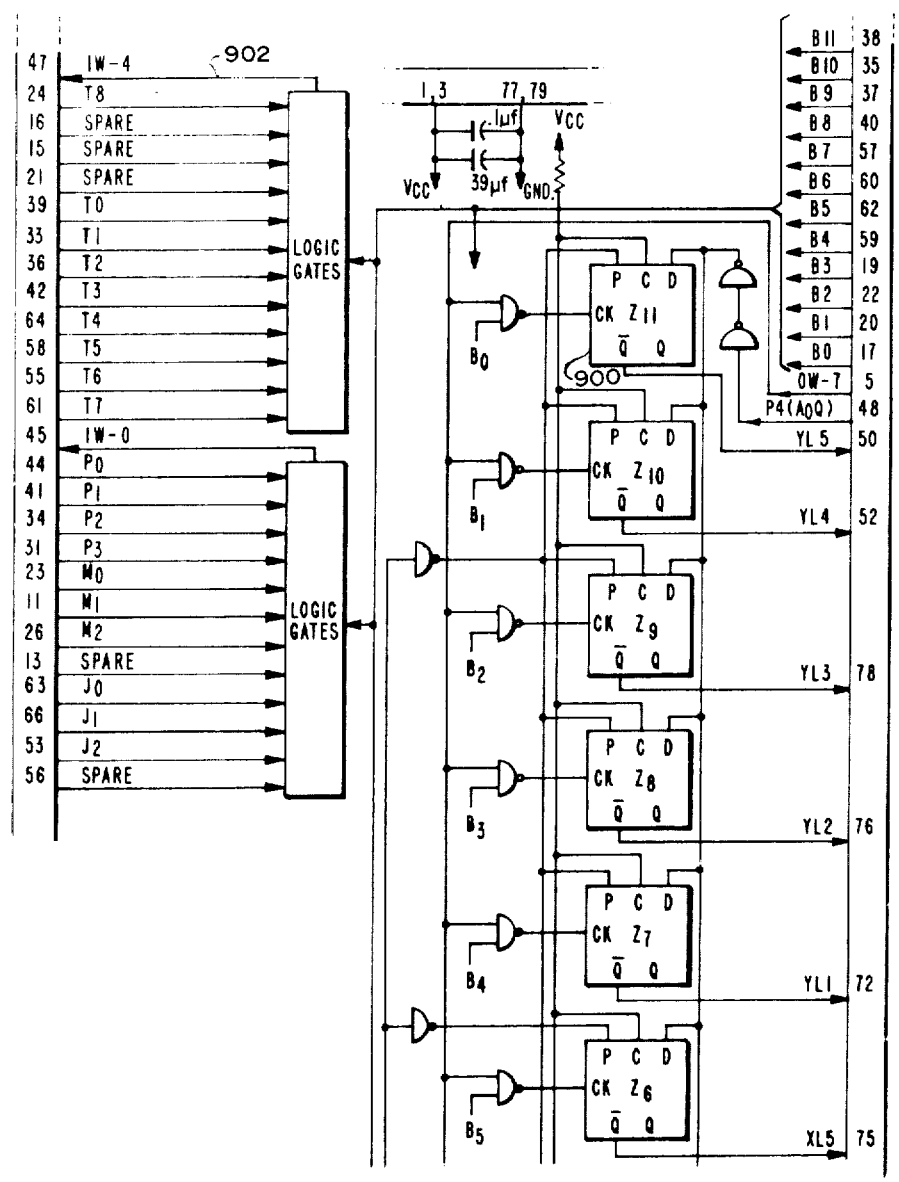
FIG. 9 is a schematic and block diagram representation of the IFA-2 circuit board.

FIGS. 1A, 1B and 2 of this application are generally the same as FIGS. 1, 4, and 2 respectively in the previously referenced parent application Ser. No. 101,881; FIGS. 8 and 9 of this application are generally the same as FIGS. 13 and 14A in the previously referenced parent application Ser. No. 101,881; and FIG. 4 of this application is generally the same as FIG. 4 in the previously referenced applications Ser. No. 101,449 and Ser. No. 354,590 and is generally the same as FIG. 2D in the previously referenced parent application Ser. No. 101,881; with minor changes such as with the reassignment of reference numerals to make those figures compatible with the form of this application.

The elements in FIG. 1A are either described in detail in the copending patent applications or are well known elements. The system 110 is described in the parent application Factored Data Processing System for Dedicated Applications at pages 1-16. Data processor 112 is described in detail in the parent application Factored Data Processing System for Dedicated Applications at pages 16-18 and 34-102. Input/output channels such as auxiliary channels 128 are described in detail in the parent application Factored Data Processing System for Dedicated Applications such as at pages 83-84. Tape reader 116 is described in detail in the parent application Factored Data Processing System for Dedicated Applications such as at page 32. Operator panel 182, comprising control panel 114 and display panel 118, is described in detail in the parent application Factored Data Processing System for Dedicated Applications at pages 19-31 and in the copending patent application Interactive Control System at pages 1-19. Servos 120-122 are described in the parent applications Factored Data Processing System for Dedicated Applications at pages 32-34 and 84-88, and in copending patent applications Control System and Method at pages 1-23 and Control Apparatus at pages 1-33. The operation of the system of this invention in a numerical control system embodiment is further discussed in copending patent applications Data Processing System for Machine Control and Computerized Numerical Control System. These disclosures are provided in detail in the copending applications and are incorporated herein by reference. Other elements such as data link 150, auxiliary memory 152, tape punch 154, typewriter 156, CRT 158, computer center 160 and various external devices 162 are well known in the art.

The system of this invention will now be described, where the previously referenced parent application Ser. No. 101,881 provides a general disclosure for this invention. The system 110 is shown in FIG. 1A. The data processor 112 communicates with the control panel 114 and the display panel 118 over signal lines 115. The primary function of the main memory 130 is to contain the stored program for the data processor 112. In the preferred embodiment, this main memory is an integrated circuit read only memory. In an alternate embodiment, this main memory is a core memory which may also be used to store business data.

Prior art systems may use remote computers to process business data, and may use local, non-computerized systems for real time operations. Problems associated with using a remote computer and the limitations of a non-computerized local system have greatly limited their effectiveness. The system of this invention provides a local, dedicated computer contained in the system for performing real time operations.

Terminology used in this description now will be defined to more clearly illustrate the intended meaning.

The terms "off-line" and "stand-alone" are terms that refer to the operation of a device in a self contained manner such as a prior art peripheral, without the requirement for interaction with the data processor in real time under program control.

The term "word" is intended to mean a generalized parameter comprising a plurality of digital bits or other conditions and may relate to letters, numbers, combinations of letters and numbers, or other such groups of conditions.

The term computer as used herein is intended to mean a stored program digital data processor. This includes the well known prior art general purpose digital computers such as mini-computers, but also includes the monolithic data processor and factored data processor disclosed herein and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain it's physical or operational identity. This invention is not limited to a single computer but may include a plurality of computers associated with various portions of the prime task and sub-tasks.

A data processing system can be structured with (1) extremities that may have a physical size and form and (2) monolithic data processors that may have relative inconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

Systems Architecture

The factored computer system of this invention provides a major conceptual departure from prior art computer systems. To adequately describe the means and method of this invention, it is necessary to adapt terminology indicative of the new and unique inventive features. This terminology is defined by useage and by example herein to provide a basis for characterizing this invention.

Systems incorporating data processing capabilities distribute and disperse physical and operative properties with relation to external as well as internal system functions. Viewed in conceptual terms, such systems are "factored" in that they are structured as an entity from elemental terms encompassing both internal and external functions and physical as well as operative properties. Physical distribution of subsystems, extremities and circuits and/or the operative dispersion of programming and time-sharing capability are used in mutually interdependent fashion. Closely related to this, at least some of the subsystems or external units are not peripherals in the conventional sense, but are "elemental extremities" of the system itself, operating in what are termed "intrinsic" signal forms. The system, by its physical distribution or operative dispersion or both effects the preprocessing and signal conversion needed for translation to or from other subsystem signal forms.

Systems in accordance with the invention are characterized by a unique combination of high performance, versatility, and low cost. The versatility results from extension of the general purpose nature of a data processor to the entirety of the system, including its functional extremities. Consequently, the system can often be oriented to perform a significantly different task or tasks primarily with programming changes. The concurrent low cost is attained in large part by usage of elemental input and output units of ultimate simplicity. A mutual interdependence is employed, on a systems basis, between processor-dependent extremities and widespread operative dispersion to contribute significantly to these results. Of great importance, it is to be noted that this novel restructuring into factored systems does not unduly burden or inherently restrict the data processor capability. Instead, the system acquires a more general purpose capability.

An important aspect of the invention is that systems in accordance with it may be committed for best cost-performance characteristics to the performance of a given task or class of tasks by virtue of employment of only those extremities associated with the selected tasks. In such situations, only particular extremities are employed, extraneous data processor capability is reduced, and the physical distribution of the system may be optimally varied toward the chosen ends, while retaining the general purpose processor capability on a systems level. In a specific example given by way of illustrations hereafter; a factored business system utilizes operative dispersion in conjunction with elemental extremities performing prime functions.

Novel usage is made cojointly of operative dispersion of functions, where the data processor may be required to perform subsidiary subtasks under program control; thereby permitting communication between a data processor and an extremity in signal format intrinsic to that extremity and acceptable to the data processor. These relationships become most clear as they pertain to elemental extremities or appendages, which not only fulfill the functions of the prior art overstructured peripherals, but constitute generalized operators of much greater versatility. Such systems become "committed" to a particular task or family of tasks when the extremities or appendages are limited to those needed for that task and when computational and memory capabilities are similarly optimized.

A general purpose data processor is provided with digital portions fully implementable with integrated circuits. Thus, an integrated circuit read only memory (ROM) provides an example of a capability not found in present data processing systems. Other examples are a random access memory (RAM) and other types of flip-flop memories, which may be used alone or in combinations of integrated circuit memories for this data processing system.

In accordance with the basic concepts of a factored data processor system, the business system provides an illustration of this factoring process. The data processor 112 is used in conjunction with the various extremities of the system including elemental extremities. The data processor 112 has a distributed characteristic, where the raw instruction signals such as micro-operation and operand address signals are communicated in intrinsic signal form to the input/output structure which is physically distributed and set apart from the data processor 112 and the various extremities that communicate with the data processor 112 through this input-output structure.

The data processor 112 is shown by way of this example to be used in conjunction with the main memory 130. The basic architecture of this data processor permits the use of an integrated circuit memory, preferably a read only memory (ROM), but alternately a random access memory (RAM) or flip-flop memory can be used for the main memory 130 of this completely integrated circuit computer which might be called a monolithic computer.

The architecture of the data processor is oriented towards a factored data processing system to permit the data processor to operate in close conjunction with the extremities. The special organization and instruction repertoire aid in implementing this factored data processing system.

As previously discussed, only those extremities associated with the selected tasks are employed. Therefore, the extremities and/or peripherals shown in FIG. 1A and the controls and displays shown in FIG. 2 may be selected as required. As an example, the machine 124 and associated axes servos 120, 121, and 122 are necessary for the numerical control system embodiment discussed in the previously referenced parent application Ser. No. 101,881; but are unnecessary for the business system embodiment discussed in this application.

The present invention more particularly incorporates the normal data processor functions of controlling, computing mathematical functions, and storing data in a physically distributed, operatively dispersed system providing concurrent internal stored program control of coaction with associated extremities. Although interfacing is not prohibited, these systems utilize substantially direct communication with elemental subsystems as needed for a chosen class of tasks.

The data processor 112 can access other subsystems through the spare I/O channels 128 for alternate sources of commands, alternate sources of information, and alternate peripheral memories. The data processor 112 accepts data and commands and generates data and commands at data rates and at operating times dictated by the source and destination of these data and commands and dictated by the system operations. These requirements place a real time operational constraint on the data processor 112. Applications include processing of communications and business data, for instance, payroll systems, desk top calculators, and inventory control systems. In all of these applications the data processor 112 can process rudimentary data in the intrinsic signal form of an elemental extremity such as a control panel 114, process the non-adapted or intrinsic signals, then provide data for the system. The data processor in turn commands an output device in a signal form which may be readily useable by or intrinsic to the output device, such as a display panel 118. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign, but primarily involves changes in the data processor program.

A general purpose data processor in accordance with this invention may include multiple data and program registers, a random access memory and a scratch pad memory, and non-buffered, directly coupled input-output lines connected to elemental input-output manifesting devices. These elements perform basic or prime functions and are physically distributed at different locations in the system, with operative dispersion making them functionally available throughout the system. This system closely integrates various input and output functions into the data processor tasks. Minimal structure inputoutput extremities in this particular example comprise an elemental typewriter, operator control panel, and operator display panel. The data processor concurrently monitors these extremities, pre-processes the external manifestations into extremity-adaptable or intrinsic data, and generates extremity intrinsic or extremity-adapted extrinsic cmmands. The system concurrently operates under program control to perform the other aspects of the task, including carrying out complex computations, generating display commands, sequencing through the program, providing other controls and generating graphical and printed output data if needed.

In a typical, very generalized example of the operation of the system of FIG. 1A, the data processor 112 accepts switch inputs or other operator inputs from the control panel 114 to define the computations for system tasks. As the input extremities are operated, the data processor 112 is under real time program control to monitor the operative states and pre-process the rudimentary data itself. Concurrently and also under such program control, the display panel 118 is activated by exciting the passive elements 238 (FIG. 2) to form desired characters at a flicker-free rate. These monitoring and pre-processing subtasks concerned with the extremities continue to be carried out as needed while the processor 112 enters into its computational and processing functions concerned with its main task. Thereafter, command data is translated into output commands for the individual outputs 115A in intrinsic signal form. Compatible input signals 115B in the intrinsic format may be returned to the processor 112, pre-processed by the data processor under program control for conversion into the processor base language and utilized in further computations.

There are profound differences between systems thus arranged and operated and systems of the prior art. In the physical and operational sense, the data processor 112 is a much greater portion of the whole and the associated units may be extremities of the processor 112. Each elemental extremity has certain characteristic relationships to the system, although other differences also exist. Each relies essentially upon the operatively dispersed program capabilities of the processor 112. Each further effectively relies upon the processor 112 for pre-processing nonadapted elemental signal forms for interpretation of signals and for data transfer. In this respect: digital buffering, conversion, and signal conditioning functions ordinarily provided by interface circuits are also avoided. Furthermore, the processor 112 itself need not be tailored in configuration to cooperate with predetermined interface formats and requirements. In a further respect, system extremities communicate with the data processor in intrinsic signal forms such that the programming of the processor can determine the significance of particular terms in the intrinsic signals.

Elimination of physical identities are representative of what is herein termed physical distribution, where the processor 112 can be distributed throughout the task-performing system. Yet, by virtue of the operational dispersion of the system and other prime functions, this task-performing system may readily be modified with a minimum of hardware changes to perform another task. Such change entails the essential modification of the system program and also modification of the subtask programs and their relation to the task-pertinent program. It should be appreciated that the operative dispersion of the system encompasses and eliminates much of the interface circuitry that is redundant when used in conjunction with a data processor.

The data processor 112 is organized to operate in a manner somewhat similar to presently known stored program digital computers. The fundamental theory and technology of such presently known systems are described in Chapter 11 of *Digital Computer Design Fundamentals, Yaohan Chu, McGraw-Hill Book Co., Inc. (New York,* 1962). One embodiment of the data processor of this invention is described in detail in the previously referenced parent application Ser. No. 101,881.

Data processor 112 operates in a particular base language signal format which is intrinsic to data processor 112, which is not a unique signal format to this particular invention, but is instead a common who number digital signal format in which many digital data processors operate for optimum efficiency in the computation processes. As is hereafter described in connection with the detailed description of the subsystems, the input and output subsystems may operate in signal formats that are intrinsic to the particular subsystems. Thus, the overall system 110 utilizes a number of different signal formats in various portions of the system. This is a common characteristic of most data processing systems. However, in accordance with one of the primary features of the present invention, peripheral subsystems communicate directly with the data processor 112 in the peripheral subsystems own signal format. Interface units need not be provided to convert these signals into the format of the data processor 112 or to otherwise digitally buffer or preprocess the rudimentary signals from the input peripheral subsystems or to convert the output signals from data processor 112 into the format of the output peripheral subsystems. Instead, the data processor 112, under control of its program stored in memory 130, interrogates the input peripheral subsystem such as control panel 114 and tape reader 116 directly and these input peripheral subsystems provide input signals to data processor 112 on a real time basis directly in the signal format of the respective input peripheral subsystems. Upon receipt of the real time rudimentary signals from the input peripheral subsystems, data processor 112, under control of its stored program in memory 130, performs the necessary conversion and other refinement operations on these input signals to provide the proper signal format for subsequent computations and performs the necessary preprocessing and elimination of time-ambiguous signal portions and the like which might be contained in the rudimentary input signals. Computations are then performed on the input data in the data processor 112 under control of the stored program. After the data processor computational process is completed, data processor 112 converts output signals into a signal format intrinsic to the particular output peripheral subsystem to which the signal is to be applied under control of the stored program. The output signals are then applied to the output peripheral subsystems in the respective intrinsic signal format of the peripheral subsystem, again on a real time basis. Details of the manner of application of these output signals are provided hereafter.

At this point, it is useful to compare and contrast the factored data processing system 110 of this invention with the data processing systems or general purpose digital computers of the prior art. As previously discussed; the data processor in prior art systems was used to perform complex computational functions, but was not burdened with the task of real time control and communication between the data processor and the "outside world". Instead, interface units were provided to translate input signals into the format of the data processor and to provide other digital "preprocessing" functions such as timing, sequencing, buffering and control. In a data processing system or computer system in accordance with the present invention, the data processor 112 and the various input and output peripheral subsystems are integrated together to eliminate redundant operations and to perform system functions in an optimum manner. The data processor 112 operating under the control of its stored program performs real time interface subtasks previously performed in the prior art with special purpose logic circuits such as in interface units. In addition, the data processor 112 under control of its stored program performs the digital conversion, timing, sequencing, and controlling functions which, in the prior art, were performed in interface units unique to each peripheral subsystem. The system of this invention processes signals in a plurality of different formats from different portions of the system, permitting optimization of each subsystem while retaining system control by the data processor 112 under control of its stored program. The physical boundaries between the various subsystems can then be minimized or eliminated entirely. Because the subsystems are not now stand-alone units, the components of the various subsystems can be physically located throughout the system in whatever manner is physically or mechanically optimum for the system design or manufacture. In addition, functions may be partially performed by distributed subsystems which are physically remote from a subsystem which is primarily associated with a task. For example, in a business data processing system in accordance with this invention, conversion from the signal format associated with a particular subsystem such as an elemental control panel to a different signal format can be performed by the data processor subsystem under program control. Thus, the data processor 112 may participate intimately in the control and operaton of other subsystems in the system 110. Therefore, this system 110 may be considered to be an integrated system.

Another characteristic of the system 110 just described as contrasted with the prior art systems is that subsystems which are known in the art as peripheral subsystems are standalone subsystems which perform their assigned task in an off-line manner relatively independently from the rest of the system. This is not true of elemental subsystems used in accordance with this invention. Instead, they perform as an inseparable portion of an integrated system. Thus, an elemental subsystem could equally well be termed merely the extreme elements of a system 110 in which the data processor 112 is the central element and elemental subsystems are elemental extremities. Thus, each element of the system 110; whether a central element such as the data processor 110, an intermediate element or an elemental extremity need not be required to, and frequently is not able to, independently perform all specific functions required of a prior art stand-alone peripheral subsystem which had performed a comparable task. In many instances, portions of the peripheral may be eliminated or combined with portions of other elements in the system to achieve the advantages of an integrated data processing system. Such an integrated system may be deemed to be factored in that individual elements of the system are structured for coaction with the data processor. Each elemental extremity, when used in conjunction with the stored program data processor 112, performs an assigned task under direct control of the data processor 112 which in turn operates under direct control of a program stored in the memory 130.

System communication and complexity are optimized with serial data communication, which significantly reduces interconnection and logic. In this preferred embodiment, serial communication is illustrated as the sequential processing of single bit bytes of information. It will become obvious that sequential processing of multiple bit bytes can also be provided. Processing is herein intended to mean not only data manipulation within the data processor 112, but also the transmission of data to and from the data processor 112. Serial data communication is exemplified with an input/output instruction labeled EX and described in the previously referenced parent application Ser. No. 101,881 and as described hereafter for the serial typewriter communication through the auxiliary I/O channels 128.

The architecture of the data processor 112 lends itself to a fully integrated circuit computer mainframe; where all of the logic may be implemented with integrated circuits in a conventional manner. The main memory 130 may include a first integrated circuit read only memory portion for program or constant storage and a second integrated circuit scratch pad memory portion for the storage of operands. Such an arrangement yields a data processor having the digital portions thereof constructed wholly of integrated circuits.

The physical distribution and integration characteristics of the system 110 may be extended from the system level to the subsystem level by application of the principles of system integration and physical distribution to the elements of the data processor, where the conventional data processor elements may be integrated or physically distributed in such a manner so as to obscure the prior art distinction between these elements. This may be carried to a point where the task supporting subsystems lose their separate identities as they are known in a conventional sense and become extremities of the integrated but physically distributed system 110.

The control panel 114 and display panel 118 are examples of elemental extremities having physical distribution and operative dispersion, and operating with intrinsic signal forms in accordance with the invention. The operative dispersion of the system permits the elemental processor dependent display panel 118 to operate in conjunction with other elements performing prime functions to accomplish a subtask, the communication of information between an operator and the system 110.

Program Operations

The data processor 112 may be any well known data processor arrangement such as a well known mini-computer; but, in a preferred embodiment, is the data processor described in detail in the parent application, Factored Data Processing System for Dedicated Applications.

Computer programming techniques are well known in the prior art. Programs may be defined in a descriptive text form, in a compiler language such as Fortran, in an assembler language, or directly in the "machine language" of a particular computer. For illustrative purposes, flow charts are used to define computer programs. For simplicity of illustration, the program operations associated with one embodiment of this invention are exemplified with descriptions and flow charts. These descriptions and flow charts are in a form well known in the programming art and may be converted to other programming descriptions such as compiler, assembler, and machine languages by those skilled in the programming art. Such well known programming techniques are described in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference.

Figure 3:
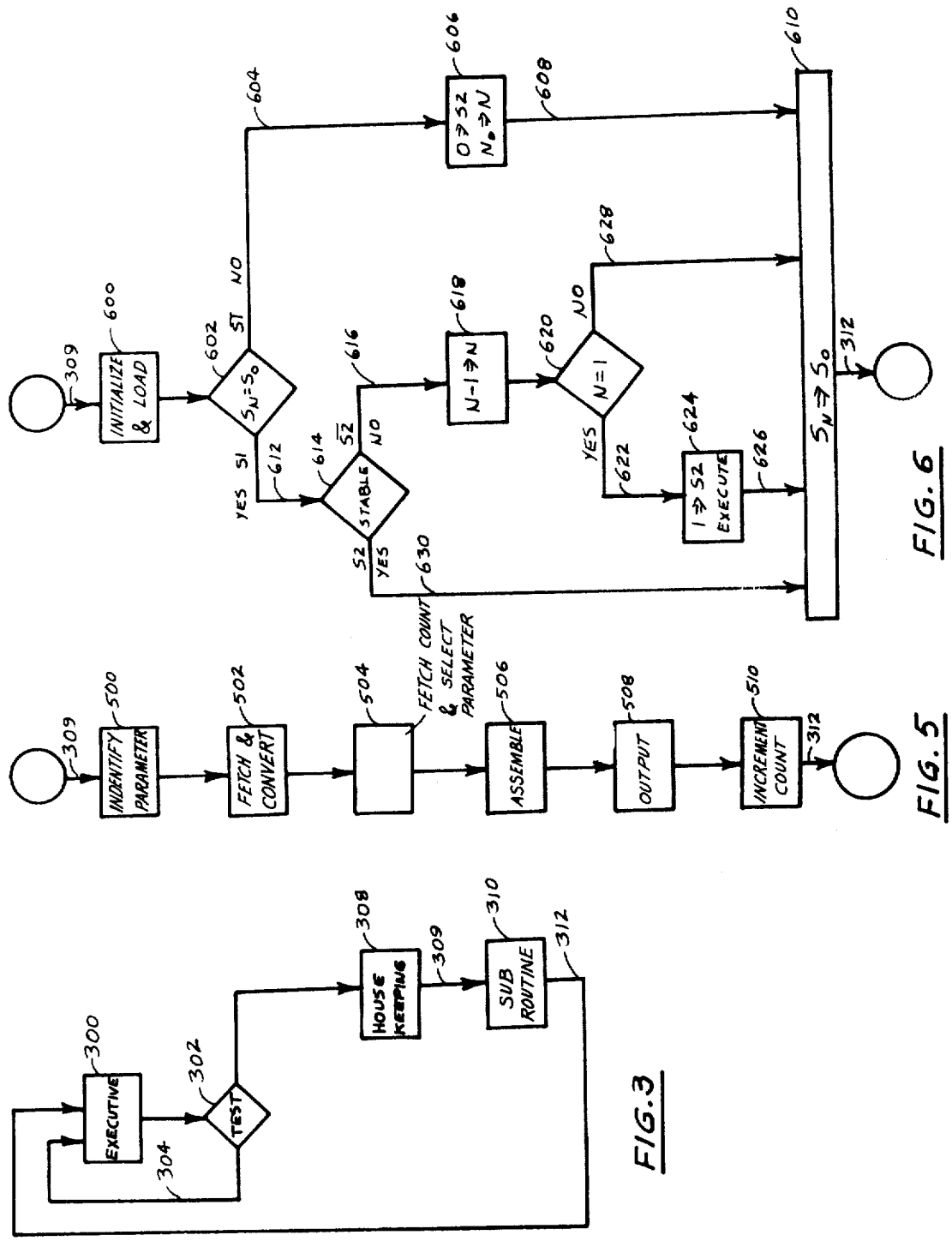
FIG. 3 is a data processor flow diagram illustrating time shared operations.

The data processor 112 executes an executive program to control all program operations and provide for time sharing with program routines. Under control of the executive program, data processor 112 detects and conditions input signals then transfers to various program subroutines which control the data processor 112 as it performs computations and generates output signals. The data processor 112 can execute programs on a time shared basis by brancing out of subroutines such as on a sequential, interrupt, or priority basis in a manner well known in the art. For simplicity of description, relatively complex program operations such as time sharing operations are not shown in the flow diagrams in FIGS. 5, 6 and 7; but will become obvious to those skilled in the art. The data processor stored program will be described hereafter. The program for controlling the data processor 112 is responsive to a stored program contained in main memory 130 to provide this processing cabability. As shown in FIG. 3, operation of the data processor 112 is controlled by an executive routine 300 where the executive routine accesses the subroutines to be executed, sets the priority of these subroutines, defines the timing, and controls other such well-known operations. The executive routine 300 controls the data processor to periodically test the real time parameter in operation 302 to determine if it is time to enter one of the real time subroutines. The real time parameter may be derived, for instance, from a real time clock, a program timer in the executive routine 300, or other well known means and methods for deriving this parameter. In one embodiment, this timer may be implicit in the stored program, where a transfer to the appropriate subroutine is provided for after a certain number of instructions have been executed, thereby implying the required real time period. If the required periods have not expired, the data processor will return to the executive routine as indicated by path 304. If one of the required periods has expired to within the required tolerance, the data processor will preserve the return address and other parameters for later reentry to the executive routine 300 and perform other required housekeeping functions in operation 308. Then the data processor will enter a subroutine 310 as indicated by a path 309 to perform the required program operations. The data processor will exit the subroutine 310 by fetching the return address preserved in operation 308, and then transferring back to the executive routine 300 as indicated by a path 312.

The packing and unpacking program operations will now be discussed.

A packed discrete word may be considered to be a word with a plurality of condition bits representing command conditions or status conditions. For example, the data processor can output a discrete packed word with command conditions to an interface register to command various discrete machine operations and the computer can input a packed discrete word with status conditions from an interface register to define various discrete machine status conditions. The packing and unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control a machine spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word containing zeros in the bit positions to be modified to zero set the related bits in the command word, then logically ORing that command word with a second control word to pack command bits into the appropriate positions of the command word. The new command word is output to an output holding register to store machine commands and also stored in the computer as a record of the current machine command conditions.

In this manner, condition bits can be packed into or unpacked from digital words for the interface arrangement described herein. Other interface arrangements and programming methods will become obvious to those skilled in the art.

Data Processor

A general purpose data processor is provided with the digital portions fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this processing system.

As shown in FIG. 1A, the data processor 112 receives data from the various input sources, performs calculations or otherwise manipulates data in accordance with the input information and outputs processed information to control the milling machine 124 through servos 120, 121 and 122 and auxiliary control signals 126A and 126B. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor with the digital portion constructed wholly of integrated circuit components.

In a somewhat simplified block diagram, the data processor 112 is shown in FIG. 1B as control logic 102 interconnecting registers, timers and communication channels. Signal definitions are provided to permit those knowledgeable in the art to identify the various connections between boards.

The data processor is organized to process 8 bit words with most working and storage registers having a 16 bit capacity permitting the storage of two words. Serial transfer of data is used throughout the data processor 112 to minimize the logic and interconnections required.

The data processor 112 includes a 12 bit memory address register (M Register) which defines a memory location being accessed in the main memory 130. A memory data register (D-register) defines an operand location such as in the scratch pad memory and input/output (I/O) channels. Thirty two Scratch Pad Memory (SPM) Registers provide convenient intermediate storage, independent of the main memory. A three bit counter divides the execution of program instructions into word times and a four bit counter subdivides the word times into bit times, the basic operating intervals.

The data processor operates by executing programmed instructions received from the main memory. When an instruction is received, control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation the data processor recycles through the matrix to begin execution of the next instruction.

The basic timing functions of the data processor 112 are performed by a word timer 104 and a bit timer 106. The fundamental synchronization of the central processor 112 is provided by an 8 MHz clock signal which is included as part of the control logic 102. The synchronizing clock signal is an asymmetric square wave, the positive portion of which is designated $P_3$ and the negative portion of which is designated $\overline{P_3}$. The asymmetrical character of the clock signal permits a longer clock period for stabilization of propogation delays without sacrifice of processing speed. The word timer 104 is a three-bit counter with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104. These output signals are used by the control logic 102 for sequencing the data processor through the micro operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro operation or word time.

An accumulator (A-register) 108 is the basic arithmetic register and is used as the repository of the results of arithmetic and logical operations. It is also the source and destination of the input/output (I/O) parameters. The A-register is a 16 bit serial in, serial out shift register. Associated with the A-register 108 is a serial full adder which in FIG. 1B is included within the control logic 102.

A scratch pad memory (SPM) 170 provides storage for intermediate parameters such as computational results, return addresses, indexes and other pertinent information. The SPM 170 provides rapid internal storage without the need for transferring data to the main memory 130. It is a group of 32 16 bit serial in, serial out registers which are divided into two pages with 16 registers on each page. Paging is accomplished by toggling a flip-flop, which is automatically set to page 0 when the power is turned on. When the SPM is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is generally used as a TX instruction register (decrement and transfer on non-negative) where the index byte to identify the $SPM_0$ register is automatically assumed and need not be programmed in conjunction with the TX instruction. The $SPM_2$ register is used for the return address associated with the execution of transfer-type instructions. In addition the $SPM_2$ register is used as the intermediate register for operands obtained from the constant memory portion of the main memory. The first eight SPM registers can be used for index or TX instructions in addition to scratch pad operations.

A memory address register (M-register) 172 holds the 12 bit address of an eight-bit byte to be accessed from the program memory. The M-register is a 12 bit shift register having the capability to address up to 4,096 different memory locations. It has a serial input and both serial and parallel outputs. Associated with the M-register but represented as being within the control logic 102 is a serial full adder which increments the M-register to access sequential instructions or, as applicable, the next two bytes of in-line instructions. The M-register is incremented by two for a TX instruction when the condition for that transfer is not met, resulting in a skip of two bytes. The M-register is incremented by three for a skip-on-discrete (SD) instruction. The M-register is exchanged with the $SPM_2$ register for transfer type instructions and exchanged with a data address register (D-register) 174 to access operands from the main memory. The M-register is also exchanged with the $SPM_2$ register at the start of an ST instruction which causes the contents of the A-register to be stored in the main memory when implemented with a core memory.

The data address register (D-register) 174 is a 12 bit shift register that usually contains an operand address and is used to select: (a) SPM register, (b) I/O channel, and (c) number of shifts, depending upon the type of instruction being executed. The D-register has a serial input and serial output, with the eight least significant bits ($D_0 - D_7$) having parallel outputs in addition.

A C-register 176 is composed of six flip-flops designated $C_3, C_2, C_1, C_0, K_{11}$, and $K_{10}$ which store the six most significant bits of an eight-bit instruction byte obtained from program memory. The flip flops $C_3$ through $K_{10}$ store the instruction bits designated $I_7, I_6, I_5, I_4, I_3$ and $I_2$, respectively as received from the main memory interface lines (I). These instruction bits are held by the C-register during the performance of an instruction to control the sequence of micro operations executed during the performance of the instruction.

An element designated K-register 178 is not a single register but rather a group of miscellaneous flip-flops for various functions. The $K_6$ and $K_9$ flip flops are not mechanized. The $K_0$, $K_1$ and $K_2$ flip-flops are used primarily to control sequencing through the micro operations. The $K_1$ flip-flop is also used to store the sign of the operand in the A-register and the sign of a decremented number during a TX instruction. The $K_2$ flip-flop is also used to extend the A-register during a shift left operation where the $K_2$ register acts as the $A_{-1}$ stage of the A-register. The $K_3$, $K_4$, and $K_5$ flip-flops may be grouped together and designated the KA-register and may be used to store the address of the index. The KA-register is also used as an extension of the A-register during a shift left operation with $K_3$ as the $A_{-2}$ stage, $K_4$ as the $A_{-3}$ stage, and $K_5$ as the $A_{-4}$ stage of the A-register. The $K_7$ flip-flop is primarily used as a carry flip-flop in conjunction with the A-register full adder. It is also used in the FK micro operation in the transfer of the D-register contents to the M-register as a shift left operation to multiply the D-register word address by two to obtain the M-register byte address. The $K_8$ flip-flop is used as a carry flip-flop in conjunction with the M-register full adder. As previously described, the $K_{10}$ and $K_{11}$ flip-flops form the two least significant bits of the C-register.

An element designated L-register 180 is, like the K-register, a group of miscellaneous flip-flops performing control functions. The most significant is the $L_1$ flip-flop which controls turn-on and turn-off of the data processor.

Input/output (I/O) channels 183 include whole number and discrete channels. The whole number channels connect the A-register with the various entities and extremities. The whole number I/O channels are arranged in pairs so that as the output from the least significant bit ($A_0Q$) of the A-register shifts information to an output channel with a corresponding input channel simultaneously shifting information into the A-register through the input to the most significant bit ($A_{15}D$).

A data path 184 provides two-way communication between the data processor and the main memory. This path carries the main memory address stored in the M-register and transfers operands to or from the main memory.

Operation Panel

An operator display and control panel for a business data processing system in accordance with the present invention minimizes hardwiring and specialized components and circuits and provides bidirectional communication between a data processor and an operator. The operator panel also includes input and output elements having generalized identities. The operator panel 182 comprising control panel 114 and display panel 118 operates with the data processor 112 in a mutually interdependent fashion to yield interactive capability for operator functions. The data processor 112 processes and interprets serial multiplexed signals representing the input word and generates appropriate system responses. The data processor 112 also processes and generates serial multiplexed output words having a selected format for controlling lamp displays and segmented elements generating numeric displays. Consequently, the panel and system have relatively few interconnections but the use of generalized terms permits input conditions and output displays to have varying and selectable meanings, as determined by the data processing stored program. The display panel includes decoders and drivers which illuminate displays in response to data processor output words. Circuitry is reduced by using a single character numeric display register 498 to control illumination of several numeric displays 408 by sequentially illuminating the numeric displays at a flicker-free rate.

The operator panel of this invention is a processor dependent structure having means for receiving panel elements, circuit conductors for coupling elements in the conductive paths, and circuits for converting the signals to generalized terms. By this arrangement, elements can be added or changed and the significance of given panel positions can be determined at processor option under stored program control. The direct wiring of input and output elements is avoided for the most part and flexibility is maintained because the operation of an input or output element can be defined with a program stored in the memory 130.

A display panel may be composed of both lamp displays and numeric displays. The data processor provides output words to the display registers to cause appropriate displays to be illuminated.

The absence of direct wiring connections between the operator panel and the data processing system not only reduces manufacturing costs but provides tremendous versatility within a family of tasks to which the data processing system may be committed. System controls and displays can be varied by merely adding or deleting spare switches and spare displays and changing associated legends. Corresponding changes in data processor responses are accomplished by making appropriate changes in the stored program.

As illustrated in FIG. 2, the control panel 114 and the display panel 118 are mounted in a single rectangular plane 299 that may be a single printed circuit board, such as a "motherboard", with the display panel 118 occupying the upper portion of the plane and the control panel 114 occupying the lower portion of the plane. The lefthand portion of the display panel 118 is occupied by status indicator lamp displays 233 and the righthand portion of the display panel 118 is composed of eight numeric displays 238. The data processor 112 generates preprocessed intermediary output words having selected formats and transfers them from an A-register 488 to a numeric display register 498 through I/O Channel-9 402. The interpretation and processing of intermediary words takes place within the data processor 112.

The panel components are mounted and interconnected on the printed circuit motherboard 299. The switches, both momentary and selector types, may be inserted directly into the pads on the printed circuit board substrate and soldered to the printed circuit pads. The lamp elements 233 and numeric elements 238 may be inserted directly into the printed circuit pads and soldered or may be inserted into sockets for ease of replacement, where these sockets are inserted directly into the printed circuit pads and solered. Various passive and active electronic circuit components may be inserted directly into pads on the printed circuit board substrate and soldered to the printed circuit pads. These components may include resistors, transistors and integrated circuits. Various printed circuit and soldering devices and methods are well known in the art. An array of spaced apart switch and display devices is thus formed with the printed circuit board 299 as a substrate for mounting and interconnecting components. Many advantages result; including the reduction in parts such as multiple small printed circuit boards, connectors, cabling, wire bundles, mounting devices, backplane devices, and others. This results in a low cost, reliable, and versatile operator panel comprising control panel 114 and display panel 118.

The operator panel may be defined as having planar or "flat-plane construction", where the switches, displays, and electronics are mounted on the flat plane motherboard comprising substantially a complete subsystem on a single flat plane device. The flat plane construction eliminates excessive hardware devices and assembly effort; where mounting hardware, plugs, cables, and other such devices are eliminated for this monolithic type flat plane construction.

The flat plane construction can be enhanced with a batch fabricated or monolithic keyboard such as the keyboard manufactured by Datanetics Corporation part number DC-404 comprising a contact substrate, spacer, and conductive diaphram. The substrate can be of conventional printed circuit board type construction and can be extended beyond the switch array area for the printed circuit board interconnection and mounting of other components. Display elements can be mounted directly into pad arrays on the substrate such as end display NIXIE tubes, light emitting diodes, or liquid crystal displays; thereby enhancing the flat plane construction concept and eliminating special display orientation mounting devices. In one embodiment, even the data processor can be mounted and interconnected thereon.

Numeric Display Subsystem

This invention is further exemplified by the numeric display panel 238 described in the referenced applications Ser. No. 101,881 and Ser. No. 101,449 and discussed in detail hereafter.

The numeric display panel of this invention may be described as an elemental extremity, wherein the numeric display panel 238 does not provide for the usual interface operations such as refresh, which are performed by the data processor 112 in response to the stored program contained in the main memory 130. The numeric display panel 238 is processor dependent and requires data processor coaction for operation. The mutual interdependence of the data processor 112 and the elemental numeric display panel 238 further embodies the teaching of this invention and may be contrasted to the off-line, stand-alone peripheral operation of prior art systems.

The data processor 112 provides processing and signal translating capability, yielding versatility and low cost. The numeric display panel 238 is a processor dependent extremity that is elemental in form and communicates with the data processor 112 in signal formats intrinsic to the numeric display panel 238. Operative dispersion is used to fulfill system requirements including signal translation and communication functions; where the data processor 112 provides the data in a time format intrinsic to the elemental numeric display 238.

This elemental display panel 238 may be a part of a factored computer system 110, wherein the prime display functions have been factored and separated from the display panel 118. The factored prime functions of the display subsystem 238 may be redundant in conventional peripheral equipment where these prime functions can be performed by the data processor 112. The data processor 112 is considered to be in a non-redundant, irreducible form. Factored prime functions of the display subsystem 238 that are redundant are eliminated in the display subsystem 238 and performed with the data processor 112, thereby reducing the hardware associated with this display device and providing a minimal structured or elemental display device. The factored prime functions such as timing are merged into the data processor 112, which performs these prime functions in response to the stored program under program control. The operation of the data processor 112 is therefore dispersed throughout the system for the performance of subtasks associated with elemental extremities, where the display device 238 is dependent on this operational dispersion of the data processor 112 in the performance of the numeric display operations. The system 110 may also be considered an integrated computer system, wherein the factored prime functions that are merged into the data processor causes an overlapping of display subsystem functions as if the data processor and numeric display subsystems were integrated together. For example, the refresh timing and control operations are associated with the display 238, but are performed by the data processor 112. Display operations have been assumed by or integrated into the data processor 112, where these display subtasks are performed by the data processor 112 with the resultant elimination of display circuitry.

The elemental numeric display 238 has a passive nature, where display operation is dependent on data processor coaction to actively provide display functions such as refresh. This passivity results from the factoring and reduction of redundant prime functions. As an example of this passivity, the full display is provided to the operator as long as the data processor 112 is performing the refresh operations. If the data processor 112 became locked-up in a subroutine that precludes performance of the display operations, then the last character displayed would remain illuminated, with all other displayed characters extinguished.

The data processor 112 is physically distributed throughout the system, wherein portions of the data processor input-output section may be physically part of the elemental display extremity. The internal processor signals such as micro-operation signals may be provided to the elemental extremity such as for the transfer of data to the display register.

The digital characters for display are presented to the elemental display 238 in a preprocessed, decoded form; where the usual BCD character code is decoded to a segment select form for direct application to the display tube segments such as through segment driver circuits. The data processor 112 performs required operations that are performed in the prior art with an off-line display interface such as timing for the refresh cycle, selecting the next character from memory at the appropriate time, and other such operations.

The data processor 112 communicates with the elemental numeric display 238 in a signal form intrinsic to the elemental display 238 and acceptable to the data processor 112. These intrinsic signal forms are translated from the data processor format into the display intrinsic format under program control, then communicated to the elemental numeric display 238 in a format that is required by the elemental display 238. One example of these formats is the elemental display segment select signals and character select signals which are in a special preprocessed signal format with special timing relations intrinsic to the elemental display. The data processor 112 performs the processing required to derive these signal forms intrinsic to the display subsystem 238. Another example is the real time refresh requirement imposed by the display 238 on the data processor 112, where the data processor must provide sequential refresh commands to the display 238 at a rate and in a form dictated by the elemental display 238.

The general purpose nature of the data processor is thus extended to the elemental display extremity. A change can often be made in the operation of this elemental display with merely a change in the stored program of the data processor, eliminating the requirement for a major redesign of the display subsystem. As one example, the display can be scaled by selection of one of the decimal points at the appropriate character position, where each display element provides a decimal point segment. Another example is the addition of alphanumeric capability, where the character decode stored program routine can provide any combination of segments for a display character. Another example would be the selective refresh of a limited number of display characters such as for a short parameter, with a resultant increase in display brightness. Still another example would be to refresh various segments or characters at different rates to vary the intensity of certain segments or characters relative to others. A final example would be to refresh various segments or characters at different rates to cause certain segments or characters to flicker or to blink.

The refreshable numeric display 238 saves circuitry because only one numeric display element 408 out of eight is illuminated at one time. Rapidly illuminating each element 408 in sequence provides the appearance of a continuous display to an operator. In this invention, the data processor 112 provides decoding, counting, timing, and control operations to refresh the numeric display 238 under program control.

The data processor 112 commands the numeric display 238 by loading sequential display commands into a display register 498 (FIG. 4) at a rate required to provide a continuous display to the operator. The data processor 112 assembles the numeric element select code and the segment select bits for that display element into the A-register, then outputs this word to the display register with output word -9, (OW-9), under control of the data processor input/output (EX) instruction. In the previously referenced parent application Ser. No. 101,881; FIG. 6A illustrates the A-register 130 and FIG. 13 illustrates output word -9 (OW-9). The display register 498 excites well known transistor driver circuits 418 and 420 to excite the numeric elements 408. When the data processor program indicates that the next output is required, the next numeric output word is assembled and output to the display 118. The data processor 112 keeps track of the next element 408 in sequence to be selected and the coded pattern to be displayed under program control. When the display parameter is to be changed, the data processor 112 converts the number under program control from binary to BCD code, then from BCD to the numeric segment selection code for the character to be displayed.

The numeric displays 238 are driven sequentially in accordance with an intermediary output word stored in the numeric display register 498. Each numeric display element 408 is excited at a 30 cycle per second flicker free rate in accordance with information supplied by the data processor. The numeric display register 498 is time shared to control the excitation of all eight numeric display tubes 238. Therefore, the content must change at a cyclic rate of $8 \times 30 = 240$ times per second. When the data processor provides an intermediary output word, it is clocked into the numeric display register 498 where the first three bits select the one of eight elements to be driven and the remaining bits select the segments of the selected element which are to be excited. This arrangement affords high versatility with reduced hardware. The operation of each numeric display element 408 is under program control and only one numeric display register 498 is needed to drive all eight numeric display elements 408.

The numeric display elements 408 may be segmented tubes, NIXIE tubes, light emitting diodes, liquid crystals, or other well known display elements. Output words are transferred to the numeric display register 498 at a rapid periodic rate. One portion of these words contains an element select code 415 identifying a particular element and a second part of the word contains a segment select code 419 identifying the character to be displayed with that selected element. Appropriate segment drivers 420 and select drivers 418 are responsive to the numeric display register 498 and cause the appropriate segments 421 of the selected numeric display element 408 to be activated to display the required character. Each numeric display 408 is then driven in turn, sequentially, to display its associated character. In order to drive each element 408 at a flicker-free rate of thirty times per second, the data processor 112 provides a new word for the numeric display register 498 at a cyclic rate of thirty times the number of elements 408 each second. Assuming eight elements, the rate would be 240 times per second, which would consume only a small part of the operating time of a modern high speed data processor such as described in the previously referenced parent application Ser. No. 101,881.

The numeric display functions are performed by the data processor 112 under program control and may include real time clocking, refresh counting, upddate controlling, and refresh control. These functions are not physically identifiable, but are implemented under program control in the data processor. Also under program control, the display parameter is converted from a binary to a BCD code, then modified for the special segment code requirements of the elements 408. The element identification code is assembled into the word, which is output to the numeric display register 498 in the display panel 118.

A program flow diagram is shown in FIG. 5 to illustrate one embodiment of the numeric display operation. The real time executive routine, previously described in conjunction with FIG. 3 will provide entry to this display subroutine along path 309. The data processor will then identify the parameter to be displayed in operation 500, such as by the interrogation of the parameter switch 242, then fetch the selected parameter from memory, then perform a binary to BCD conversion and a BCD to segment select code conversion in operation 502 to obtain the decimal segment select code. The data processor will next fetch the refresh counter parameter from memory to be used as the numeric element identification, then select the appropriate decimal character defined by that refresh counter parameter in operation 504, then assemble the refresh counter parameter into the most significant portion of the A-register 488 and assemble the selected decoded decimal character in the least significant portion of the A-register 488 in operation 506. This operation can be performed with masking techniques or other well known program techniques. The assembled word in the A-register 488 is then output to the numeric display register 498 in operation 508 to excite the appropriate segments 421 of the selected display element. The input output-9 instruction is used to select the I/O-9 channel 402 for the numeric display register update. The data processor again accesses the refresh counter parameter, increments this parameter, and stores this updated parameter for the next refresh iteration in operation 510. The data processor then accesses the return address and transfers to the executive routine along path 312 as previously described.

In order to excite one of the numeric display elements 408, the data processor 112 utilizes the count of the refresh counter to access a location in the memory storing information to excite the selected element 414 with the proper character. This information is accessed from the memory and assembled in the least significant portion of the A-register 488 where it is joined by the binary count from the refresh counter in the most significant portion to form the intermediary digital output word. This output word is transferred from the A-register 488 through I/O Channel-9 402 to the numeric display register 498. After the word is output, the refresh counter is incremented so that the next element in sequence will be excited on the next refresh iteration. The data processor 112 also updates the locations in the memory which store the parameter to be displayed. This parameter updating occurs approximately twice per second, which is about as fast as the operator can respond to changes in the parameters.

The contents of the three element select bits in the most significant portion of the numeric display register 498 are communicated as element select signals 415 to the decoder 416, which decodes these signals to activate one of eight select drivers 418 with the element select signals 417. Simultaneously, nine segment drivers 420 are selectively excited with the segment select signals 419 from the least significant portion of the numeric display register 498, each driver being responsive to a different bit. In another embodiment, the element select bits are assembled in the numeric display register 498 in decoded form, thereby eliminating the decoder 416 but increasing the size of the numeric display register. Other embodiments will become obvious to those skilled in the art.

Switch Control

This invention is further exemplified by the switch control panel 114 described in the referenced applications Ser. No. 101,881 and Ser. No. 101,449 and discussed in detail hereafter.

The switch control panel of this invention may be described as an elemental extremity, wherein the switch panel 114 does not provide for the usual interface operations such as elimination of switch bounce, which is performed by the data processor 112 in response to the stored program contained in the main memory 130. The switch panel 114 is thus processor dependent and requires data processor coaction for operation.

The data processor 112 provides processing and signal translating capability, yielding versatility and low cost. The switch panel 114 is a processor dependent extremity that is elemental in form and communicates with the data processor 112 is signal formats intrinsic to the switch panel 114. Operative dispersion is used to fulfil system requirements including signal translation and communication functions; where the data processor 112 processes the data in a time format intrinsic to the elemental switch control panel 114.

The elemental switch panel 14 may be a part of a factored computer system 110, wherein the prime functions have been factored and separated from the switch panel 114. The factored prime functions of the switch subsystem 114 may be redundant, where these prime functions can be performed by the data processor 112. The data processor 112 is considered to be in a non-redundant, irreducible form. Factored prime functions of the switch subsystem 114 that are redundant are eliminated in the switch subsystem 114 and performed with the data processor 112, thereby reducing the hardware associated with this switch means and providing a minimal structured or elemental switch panel. The switch panel 114 is dependent on this operational dispersion of the data processor 112 in the performance of the switch control operations. This system 110 may also be considered an integrated computer system, wherein the factored prime functions that are merged into the data processor causes an overlapping of switch subsystem functions as if the data processor and switch subsystems were integrated together. For example, the elimination of switch bounce is associated with the switch control subsystem 114, but is performed by the data processor 112. Switch control operations have been assumed by or integrated into the data processor 112, where these switch subtasks are performed by the data processor 112 with the resultant elimination of switch circuitry.

The elemental switch control 114 has a passive nature, where switch control operation is dependent on data processor coaction to actively provide switch functions. This passivity results from the factoring and reduction of redundant prime functions. As an example of this passivity, the activation of a switch such as the mode selector switch 240 will have no effect on the system except through the data processor under program control.

The data processor 112 communicates with the elemental switch control 114 in a signal form intrinsic to the elemental switch control 114 and acceptable to the data processor 112. These intrinsic signal forms are rudimentary signals comprising ambiguous portions such as switch bounce in addition to the data portions such as the switch condition.

The general purpose nature of the data processor is this extended to the elemental switch extremity. A change can often be made in the operation of this elemental switch device with merely a change in the stored program of the data processor, eliminating the requirement for a major redesign in the switch control subsystem. The operations commanded by the switcheds can be defined merely by changing the data processor stored program, such as described for the parameter selector switch 242 in the numerical control system for both a milling machine and a lathe. For a milling machine, the assignments can be X Axis 227, Y Asis 226, Z Axis 225, B Axis 224, Sequence Number 223, Spindle Speed 222, I Arc Center 228, J Arc Center 229, K Arc Center 230, M Command 231, G Command 298, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 298, Feedrate Override 237, and spares 221, 239, and 243. These selector switch assignments can be changed and the execution can be defined under data program control. It will become obvious that this flexability in defining switch identification and control functions under program control extends to the other switches such as the momentary switches as will be described for the numerical control DNC commands hereafter.

The use of several switch controls and lamp displays, as provided for in the panel design, will permit DNC operation for the numerical control system of the related applications to be controlled from the panel, which is exemplary of this feature of the present invention. Use of the control panel to process the internally stored parts program blocks of commands is presented in the previously referenced parent application; Ser. No. 101,881 particularly page 21 lines 12 through 16 and other descriptions therein. The operation of one embodiment of the panel DNC operations will next be described with reference to FIG. 2. The switches that control the DNC operation are the DNC Source Select switch 280 and the DNC Mode switch 282. Lamp displays may be used to define the DNC modes. In one embodiment, these are a DNC lamp 270, an Execute lamp 272, an Edit lamp 274, a Delete lamp 276, and a Record lamp 278. Activation of the DNC Source switch 280 will alert the data processor to an operator command to change the source of parts program commands. The data processor 112 will alternately toggle the DNC lamp 270 to the on state, then to the off state, then to the on state and so forth in response to each activation of the DNC Source Select switch 280, alternately selecting the parts program memory and the tape reader as sources of parts program commands. When the DNC lamp 270 is illuminated, the system is in the DNC condition; where the data processor will operate on the parts program commands stored in the parts program memory. When the DNC lamp 270 is extinguished, the system is in the Tape condition where the data processor will operate on a parts program entered through the tape reader 116.

The flexibility in defining the operation of the control panel switches and the display panel lamps with the data processor under program control is described in the previously referenced parent application Ser. No. 101,881; particularly page 4 lines 29 through 30, page 5 lines 1 through 6, page 29 lines 1 through 17, page 19 lines 24 through 28 and other descriptions therein.

In one embodiment of DNC operation, the lamp displays 118 are used to define system conditions. One of the DNC mode lamps 272, 274, 276, and 278 will be illuminated to define which of the four DNC modes has been selected. The DNC Mode switch 282 will permit the operator to sequence the system through the modes until the DNC mode that is displayed satisfies the operator. Each depression of the DNC Mode switch 282 by the operator will cause the DNC Mode lamp that is illuminated to be extinguished and will cause the next DNC Mode lamp in sequence that is extinguished to be illuminated. Each depression of the DNC Mode switch 282 will cause the next one and only that one DNC mode lamp to be illuminated in the sequence of first the Execute lamp 272, next the Edit lamp 274, next the Delete lamp 276, next the Record lamp 278, and then back to the Execute lamp 272.

The control panel has three selector switches and a plurality of momentary switches as shown in FIG. 2. The three selector switches; a Mode switch 240, a Jog switch 241, and a Parameter switch 242; are multiple position rotary selector switches. The remaining switches are momentary switches which maintain contact only so long as they are held down. Because hardwiring of switch controls is avoided by having intermediary output words communicated to and interpreted by the data processor 112, the number of selector switches as well as the number of contacts on each selector switch can be easily varied to meet the requirements of a specific application.

Several alternate embodiments of the switch control means are present for illustration. Machine switch signals are shown as directly interrogated by the data processor; as illustrated in FIG. 14B of the previously referenced parent application Ser. No. 101,881; where S0 through S11 are accessed with an EX-3 instruction through scan-in logic 264 on signal line TW-3, pin 49. These switch signals are rudimentary signals containing the switch bounce characteristics and are not logically preprocessed. Selector switches 240, 241, and 242 on the control panel 114 are interrogated by the data processor; as illustrated in FIG. 14A of the previously referenced parent application Ser. No. 101,881; with P0 through P3 representing the parameter switch 242 conditions, M0 through M2 representing the mode switch 240 conditions, and J0 through J2 representing the jog switch 241 conditions; accessed with and EX-0 instruction through scan-in logic 262 on signal line IW-0, pin 45. These selector switch signals are rudimentary signals containing the switch bounce characteristic but are encoded to reduce interconnections. Momentary switches such as with the cycle start switch 246 on the control panel 114 are interrogated by the data processor; as illustrated in FIG. 15 of the previously referenced parent application Ser. No. 101,881; where SA through SE are accessed with an EX-1 instruction through scan-in logic 272 on signal line IW-1, pin 56. These momentary switch signals may have logical preprocessing to remove switch bounce, provide encoding, and provide buffering. In the preferred embodiment, the direct interrogation of the rudimentary switch signals such as described previously for the machine switch signals S0 through S11 is used. All switch signals will herein be considered to be unprocessed rudimentary switch signals as with that preferred embodiment.

Switches are well known input devices and can take many forms such as momentary switches, rotary switches, relays, and others. Also, other input devices provide input conditions that can be processed as described herein for switches such as with a typewriter and an electromechanical punched tape reader.

The data processor under program control loads a digital word 115B comprising rudimentary switch signals and processes those switch signals to obtain appropriate switch information. Various transitionary conditions such as electrical noise, switch bounce, and other such effects can cause erroneous switch information. Therefore, an embodiment is shown which requires that the transient nature of the switch condition stabilize before the switch command is executed. This is achieved by providing for multiple samples by the data processor 112 with a prescribed period between samples. The occurance of a number of sequential samples where the samples compare is required prior to executing the operation commanded by that switch.

A program flow diagram is shown in FIG. 6 to illustrate one embodiment of the switch processor operation. The real time executive routine previously described in conjunction with FIG. 3 will provide entry to this switch control subroutine along path 309. Operator response time is in the order of a few tenth seconds so execution of this subroutine approximately every one tenth second will insure detection of a proper command. Other real time periods would be provided for switch occurances faster or slower than an operators reactions, such as for relays that operate faster than an operator.

The data processor 112 will enter the switch input subroutine through operation 600, which initializes the algorithm parameters and loads the new switch input condition. This condition may be an encoded condition, a discrete non-encoded condition, or other such input. The data processor compares this new condition ($S_N$) with the old condition ($S_O$) in operation 602, where the old condition ($S_O$) was the last prior sample. If the old and the new switch conditions don't compare, then the switch condition has changed due to an operator action, electrical noise or other such cause. Data processor operation then branches along the non-compare (S1) path 604 to program operation 606, where the data processor resets the stability condition bit (S2) to the unstable state (S2) and preloads the stable sample program count parameter (N) to a predetermined count ($N_O$). This unstable state ($\overline{S2}$) identifies a change in switch condition. The preloaded count ($N_O$) in the stable sample counter defines the number of stable samples required to define a stable condition. The data processor will next follow path 608 to program operation 610 which stores the various program conditions and exits to the executive routine along path 312 as previously described.

If the old and new switch conditions do compare (S1) in operation 602, then the switch condition has not changed from the last prior sample. Data processor operation then branches along path 612 to program operation 614, where the data processor checks to determine if the switch condition is a stable condition. If the check in operation 614 shows that an unstable condition exists ($\overline{S2}$), the data processor branches along path 616 to operation 618, where the data processor decrements the stable sample count parameter (N), indicative of the switch condition remaining stable for another sample period. The data processor then makes a check in operation 620 to determine if the stable sample count parameter (N) has been decremented down to one, indicating a sufficient number of stable samples to define a stable condition and to then execute the switch command. If the stable sample count parameter (N) is one, then the data processor branches along path 622 to operation 624 where the data processor sets the unstable condition ($\overline{S2}$) to the stable condition (S2) and executes the switch command. It should be noted that the data processor executes this operation 624 only once for each change in a switch input condition. The data processor then transfers to operation 610 along path 626 and exits the subroutine as previously discussed. If the stable sample count parameter (N) in operation 618 has not counted down to one, then the data processor branches along path 628 directly to operation 610 and exits the subroutine as previously discussed. This path 628 bypasses the operation 624 and, therefore, preserves the unstable condition that exists for at least one more sample period.

If the check in operation 614 shows that a stable condition exists (S2), where the last prior switch command has been executed in operation 624, then the data processor branches along path 630 to operation 610 and exits the subroutine as previously described because there has been no new switch input to be processed.

Typewriter

This invention is further exemplified by an elemental typewriter 156. The typewriter of this invention may be described as an elemental extremity, wherein the typewriter 156 does not provide for the usual interface operations such as timing, sequencing, and controlling; which are performed by the data processor 112 in response to the stored program contained in the main memory 130. This typewriter 156 is processor dependent and requires data processor coaction for operation. The mutual interdependence of the data processor 112 and the elemental typewriter 156 further exemplifies the teaching of this invention and may be contrasted to the off-line, stand-alone peripheral operation of prior art systems.

The data processor 112 provides processing and signal translating capability, yielding versatility and low cost. The typewriter 156 is a processor dependent extremity that is elemental in form and communicates with the data processor 112 in signal formats intrinsic to the typewriter 156. Operative dispersion is used to fulfill system requirements including signal translation and communication functions; where the data processor 112 processes the data in a time format intrinsic to the elemental typewriter 156.

The elemental typewriter 156 may be a part of a factored computer system 110, wherein some prime functions have been factored and separated from the typewriter 156. The factored prime functions of the typewriter subsystem 156 may be redundant, where these prime functions can be performed by the data processor 112. The data processor 112 is considered to be in a non-redundant, irreducible form. Factored prime functions of the typewriter subsystem 156 that are redundant in conventional arrangements are eliminated in the typewriter subsystem 156 and performed with the data processor 112, thereby reducing the hardware associated with this typewriter and providing a minimal structured or elemental typewriter. The factored prime functions such as timing are merged into the data processor 112, which performs these prime functions in response to the stored program under program control. The operation of this data processor 112 is therefore dispersed throughout the system such as for the performance of subtasks associated with elemental extremities, where the typewriter device 156 is dependent on this operational dispersion of the data processor 112 in the performance of the operations. The system 110 may also be considered an integrated computer system, wherein the factored prime functions that are merged into the data processor causes an overlapping of typewriter subsystem functions as if the data processor and typewriter subsystems were integrated together. For example, the timing and control operations are associated with the typewriter 156, but are performed by the data processor 112. Typewriter operations have been assumed by or integrated into the data processor 112, where these typewriter subtasks are performed by the data processor 112 with the resultant elimination of typewriter interface circuitry.

The elemental typewriter 156 has a passive nature, where typewriter operation is dependent on data processor coaction to actively provide typewriter functions. This passivity results from the factoring and reduction of redundant prime functions.

The data processor 112 is physically distributed throughout the system, wherein portions of the data processor input-output section may be physically part of the elemental typewriter extremity. The internal processor signals such as micro-operation signals may be provided to the elemental extremity such as for the transfer of data between the data processor and typewriter subsystems.

The data processor 112 communicates with the elemental typewriter 156 in a signal form intrinsic to the elemental typewriter 156 and acceptable to the data processor 112. These intrinsic signal forms are translated from the data processor format into the typewriter intrinsic format under program control, then communicated to the elemental typewriter 156 in a format that is required by the elemental typewriter 156. One example of these formats is the elemental typewriter signals which are in a special preprocessed signal format with special timing relations intrinsic to the elemental typewriter. The data processor 112 performs the processing required to derive these signal forms intrinsic to the elemental typewriter subsystem 156. Another example is the real time requirement imposed by the elemental typewriter 156 on the data processor 112, where the data processor must provide or accept sequential commands at a rate and in a form dictated by the elemental typewriter.

The general purpose nature of the data processor 112 is thus extended to the elemental typewriter extremity. A change can often be made in the operation of the elemental typewriter with merely a change in the stored program by the data processor, eliminating the requirement for a major redesign in the typewriter subsystem. As one example, the data processor 112 could monitor the signal timing associated with the input typewriter signals and adaptively modify the timing of the output data processor signals accordingly.

A well known auxiliary input and output channel 128 is a 110 baud auxiliary channel for communication with a typewriter such as a Teletype Corporation Model ASR-33, a data link 150, an alpha-numeric CRT 158, a remote large scale computer center 160, or other devices. The 110 baud auxiliary channel provides serial data at a rate of approximately 110 bits per second. Eleven bits are required for each word; comprising a start pulse, eight data pulses and two stop pulses. In the system 110, the data processor 112 performs the timing, control, and sequencing under program control, thereby eliminating the requirement for prior art interface control devices.

For data inputs, a well-known transistor line receiver circuit provides digital integrated circuit signal levels. As described in conjunction with FIG. 8, the data processor periodically samples the input line with a Skip-On- Discrete SD instruction through Discrete Input-2 (DI-2 on pin 69 which is a Skip-On-ASR input relating to the Teletype Corporation typewriter Model ASR-33) under program control to detect a start pulse. If a start pulse is not detected, the data processor performs other program operations. If a start pulse is detected, the data processor branches to an input program, performing time delay calculations to determine when to sample each successive input sequential bit. This sample time delay precludes errors due to noise such as switch bounce that occur at the transition between binary states. The data processor assembles the successive serial bits from this input into a digital word, further processes that word for a parity check and a BCD to binary conversion and stores the data for later use. The data processor treats these input signals as rudimentary signals which have a quasi-digital characteristic rather than as absolute digital signals because these rudimentary signals have non-digital characteristics (e.g. switch transients).

For data outputs, the data processor generates commands by loading a sequence of digital command bits into an interface command flip-flop such as $I_2$ 800 (FIG. 8) or $Z_{11}$ 900 (FIG. 9) at approximately a 110 bit per second rate. The data processor 112 assembles the eight bit data word with a one bit leading start pulse and two bit trailing stop pulses in the A-register 488 (130 in the parent application). This word as updated is stored in the data processor memory for successive output iterations. The data processor fetches this word from storage, then outputs this assembled word to the appropriate auxiliary output channel at a 110 baud rate (approximately 0.009 second intervals), where the appropriate data bit is latched in an interface flip-flop 800, 900 for the period of time inbetween outputs to excite a conventional interface line driver to drive an output device.

Two auxiliary output channel arrangements will be described for this system, while others will become obvious to those skilled in the art.

A first output channel will be described with reference to FIG. 9. An output word is assembled with a start pulse in the most significant position of the A-register ($A_{15}$) and with the next data bits sequentially placed in descending order behind $A_{15}$ in that register. The Z11 flip-flop 900 is used as an output flip-flop latch to generate a YL-5 output signal on pin 50 to the line driver and output device. The A-register word is output under control of the EX-7 input/output instruction, where the A-register contents are shifted into the Z-register as signal P4(AoQ) on pin 48, with the EX-7 instruction gated clock to be provided as a signal OW-7 on pin 5. The most significant bit of the output word is latched up in the Z11 flip-flop to provide the YL-5 output signal. The assembled output word is then loaded back into the A-register from the memory and is next shifted left to place the next sequential data bit in the most significant position for the next output iteration, and then stored in the data processor memory for later outputting of the next bit in the sequence.

A second output channel will be described with reference to FIG. 8. An output word is assembled in the A-register (AoQ) and stored in memory for subsequent use for the periodic outputting of the sequential digital bits of the word. The data processor under program control will periodically interrogate the stored word to determine if the next output digital bit represents a change from the last output condition. If the next output digital bit is different from the prior output digital bit, the output signal 802 must make a transition; so the data processor toggles the $I_2$ flip-flop 800 with a discrete output -1 instruction to clock the JK toggle flip-flop 800 with the signal 806 to provide this transition of the output signal 802. If the next output digital bit is the same as the prior output digital bit, the output signal 802 must not make a transition; so the data processor does not toggle the $I_2$ flip-flop and bypasses the discrete output -1 instruction. The periodic interrogation of the output word and outputting of the next digital bit is performed at the bit rate, previously defined as 110 baud (approximately 0.009 seconds per bit). The data processor keeps track of the bit positions of the word being output such as with a bit counter, shift operations, or other well known programming techniques. As previously described, an output word always begins with a start pulse which is a false condition bit and always ends with a stop pulse which is a true condition bit. Therefore, the data processor always executes a discrete output -1 instruction to toggle the $I_2$ flip-flop 800 for the start pulse at the beginning of a new output word, then sequentially toggles the $I_2$ flip-flop 800 with the execution of the discrete output -1 instruction for each change in the state of the digital bits in the word at a bit time rate of 110 baud. When the complete word has been outputted, the data processor exits the output word routine with the $I_2$ flip-flop placed in the true state for a stop pulse condition at the end of the output word.

The auxiliary I/O channels 128 can accommodate various other I/O devices through the line drivers 154, through and the data link 150, can accommodate various other conventional external devices as illustrated by block 162.

In yet another embodiment of this invention, the business system 110 receives data and commands from a remote computer facility over a data link 150 such as a telephone line in a signal form the same as that described herein for the typewriter. The data processor 112 is responsive to this information and generates responses over the data link 150 to verify receipt of the information, request more information, transmit data, or other communication.

Figure 7C:
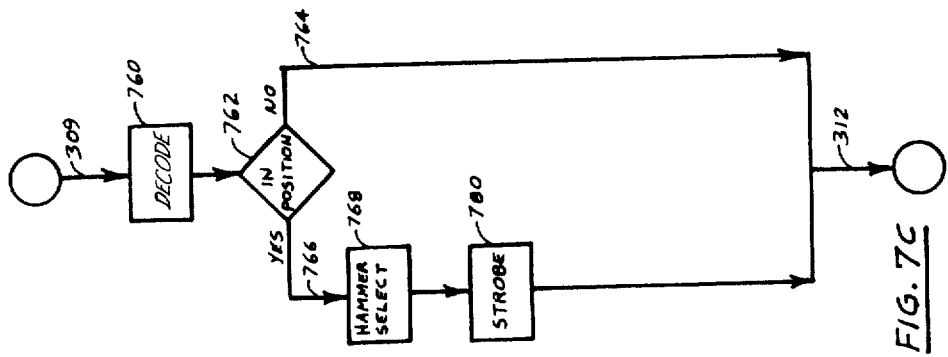
FIG. 7 is a data processor program flow diagram comprising FIG. 7A illustrating typewriter operations, FIG. 7B illustrating switch input operations, and FIG. 7C illustrating printer operations.
Figure 7B:
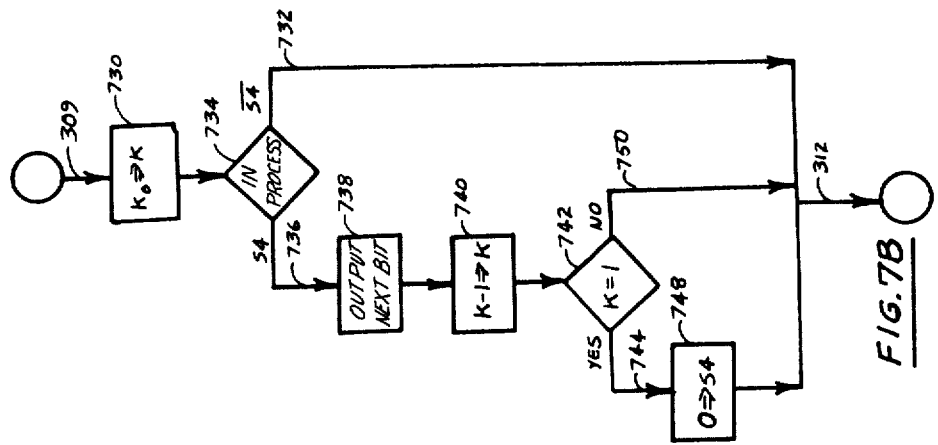
Figure 7A:
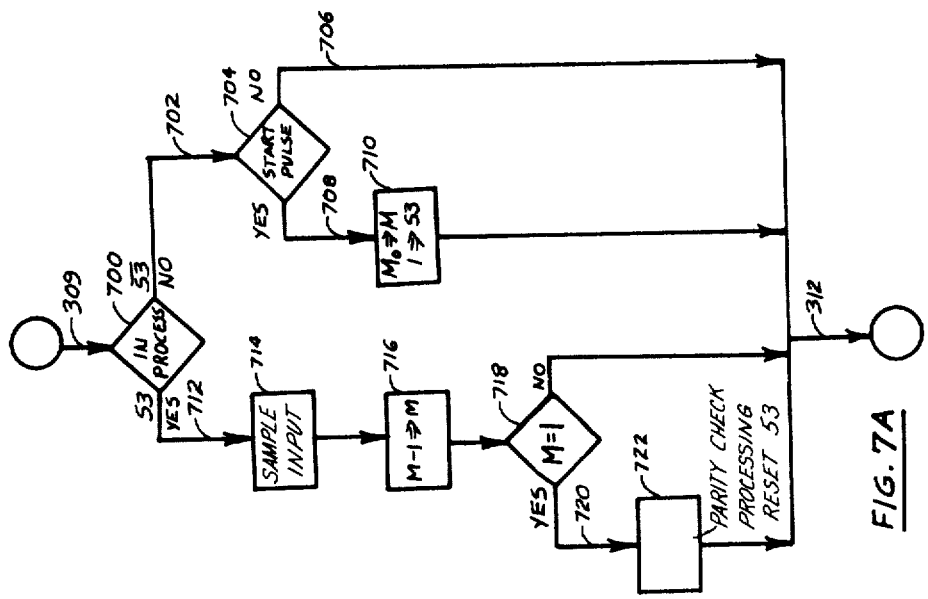

A program flow diagram is shown in FIG. 7A to illustrate one embodiment of a typewriter serial input subroutine. The real time executive routine previously described in conjunction with FIG. 3 will provide entry to the typewriter input subroutine along path 309. The data processor iteratively executes this routine to either search for a new parameter or to load a new parameter that has already been detected. The data processor will test an input condition (S3) in operation 700 to determine if an input parameter is in the process of being loaded.

If the input condition is reset ($\overline{S3}$), then a parameter is not being loaded and the data processor branches along path 702 to test for a start pulse in operation 704, indicative of a new parameter that must be input. If a start pulse is not detected in operation 704, the data processor branches along path 706 to exit the subroutine. If a start pulse is detected in operation 704, the data processor branches along path 708 to operation 710, which initializes the program conditions for the loading of a new parameter. This is accomplished by presetting the M parameter to $M_o$ for the number of bits in the input parameter and presetting the S3 condition bit to define that a parameter is now being loaded. For this example, the typewriter 156 provides a start pulse, eight data pulses, and two stop pulses; comprising eleven bits. Therefore, the M parameter is preset to the number eleven. The data processor then follows path 312 to exit the subroutine as previously discussed.

If the input condition is set (S3), then a parameter is in the process of being loaded so the data processor branches along path 712 to sample the next input data bit in operation 714 and assemble this data bit into the partial parameter that is being accumulated. The data processor then decrements the M parameter in operation 716 to keep track of the data bits that still must be loaded, then tests the M parameter in operation 718 to determine if the complete input parameter has been loaded. If the M parameter is a one in operation 718, then the complete input parameter has been loaded; so the data processor branches along path 720, to operation 722, where the data processor performs a parity check on the complete parameter, further processes that parameter as required, resets the S3 parameter indicative of the completion of processing of that input parameter, then exits the subroutine along path 312. If the M parameter is greater than one in operation 718, then the input parameter is still incomplete; so the data processor branches along path 312 to exit the subroutine.

A program flow diagram is shown in FIG. 7B to illustrate one embodiment of a typewriter serial output subroutine. The real time executive routine previously described in conjunction with FIG. 3 will provide entry to this typewriter output subroutine along path 309. If the data processor is to output a parameter, the program conditions are initialized in operation 730 by presetting the K parameter to $K_o$ for the number of bits in the output parameter. For this example, the typewriter 156 provides a start pulse, eight data pulses, and two stop pulses; comprising eleven bits. Therefore, the K parameter is preset to the number eleven. The eleven bit output parameter is assembled and stored by the data processor. The data processor tests the output condition S4 in operation 734 to determine if an output parameter is in process of being output.

If the output condition is reset ($\overline{S4}$), then a parameter is not being output; so the data processor branches along path 732 to exit the subroutine along path 312. If the output condition is set (S4), then a parameter is in the process of being output; so the data branches along path 736 to output the next data bit in operation 738. The data processor then decrements the K parameter in operation 740 to keep track of the data bits that still must be output, then tests the K parameter in operation 742 to determine if the complete output parameter has been output. If the K parameter is a one in operation 742, then the complete output parameter has been output; of the data processor branches along path 744 to operation 748, where the data processor resets the S4 parameter indicative of the completion of processing of that output parameter, then exits the subroutine along path 312. If the K parameter is greater than one in operation 742, then the output parameter is still incomplete; so the data processor branches along path 750 to path 312 to exit the subroutine.

A typical prior art line printer comprises a rotating print drum with an encoder pickoff, a set of print hammers, and hammer select logic; the arrangement and operation of which are well known to those skilled in the art. The print drum contains longitudinal rows of characters, where the characters in a row are identical and different from all other rows. Each character in a row corresponds to a column on the printed page and to a column hammer. As the drum rotates, the hammers are controlled to print the selected character as the character row past pasth the hammers. Conventional hammer select logic utilizes a BCD character register and coincidence logic to compare the character code with the pickoff code. When the character code and pickoff codes compare, the hammer is actuated to print the character.

Figure 10:
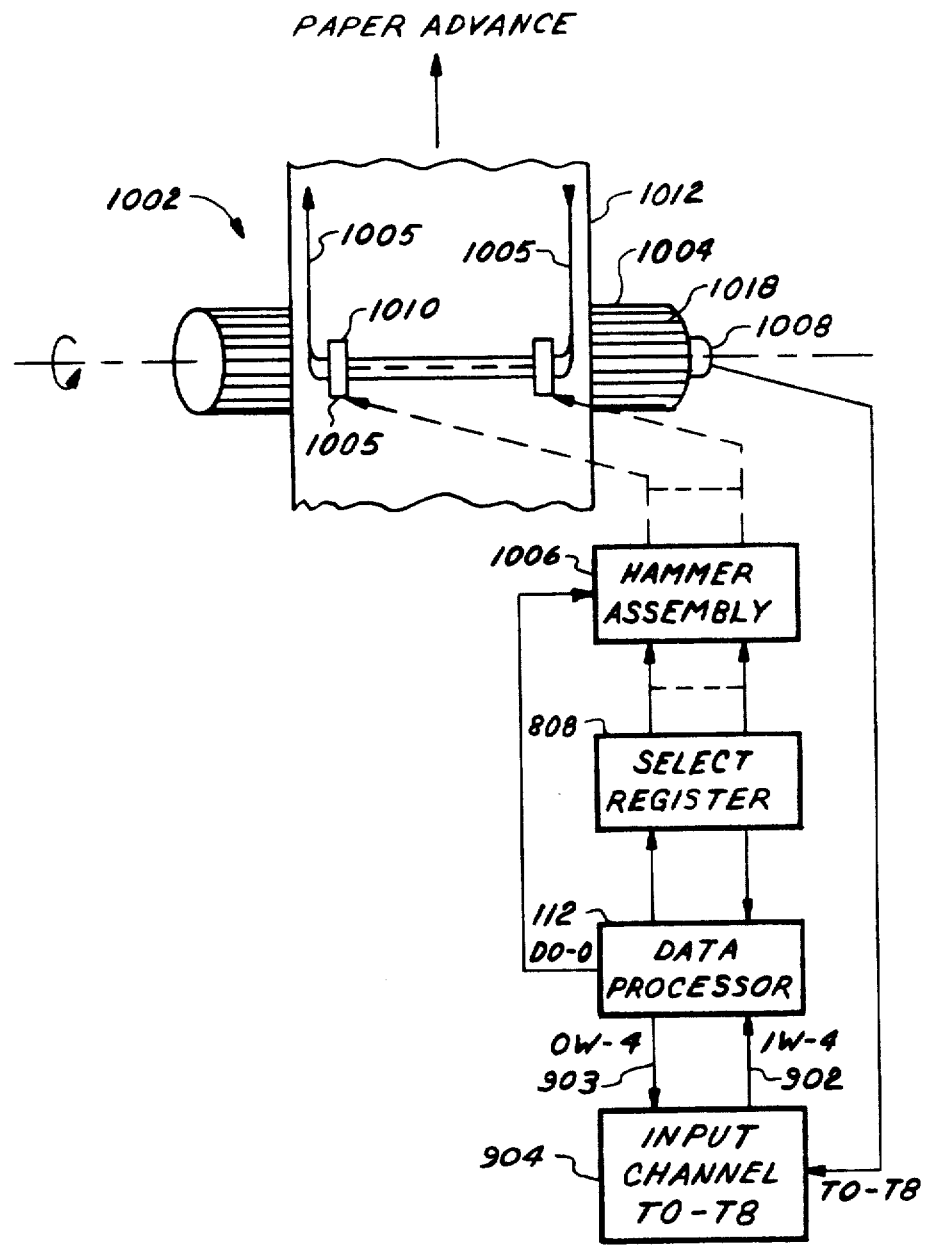
FIG. 10 is a block diagram showing interaction between the data processor and the printer.
Figure 11C:
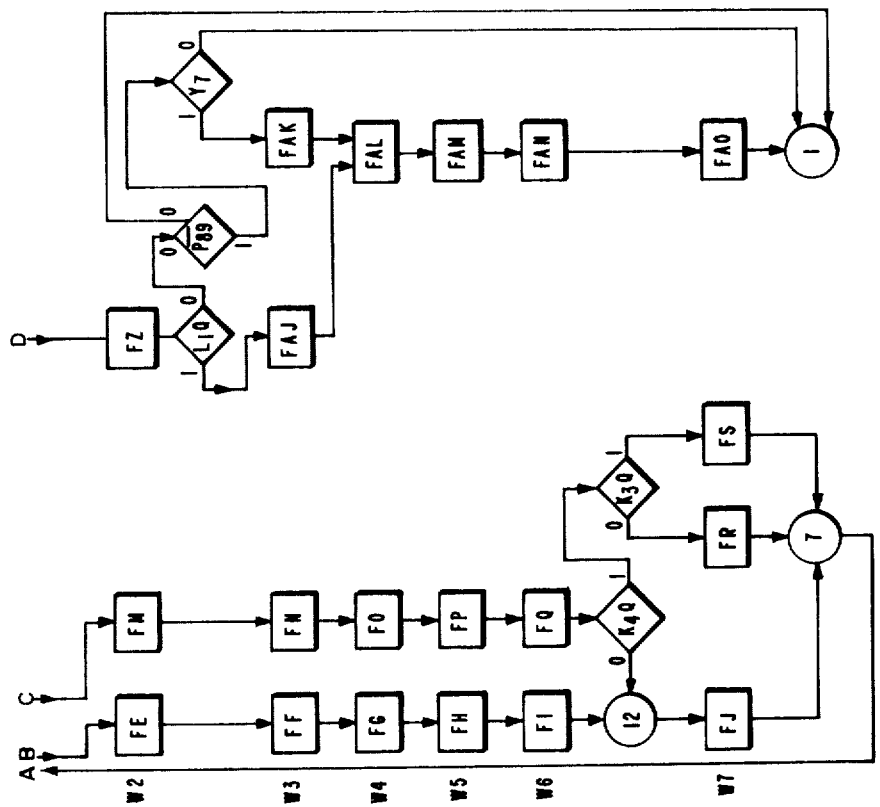

In accordance with this invention, and as illustrated in FIG. 10, an elemental line printer 1002 can be utilized by eliminating many interface functions conventionally associated with a line printer and relying instead in operational dispersion of program execution capabilities of the data processor 112. The line printer 1002 includes conventional apparatus such as a rotating print drum 1004, a hammer assembly 1006 for printing against the print drum, and a pickoff 1008 for indicating the characters that are in position for printing on the drum 1004 at the striking position of hammers 1010 which are included as part of hammer assembly 1006. The pickoff 1008 also provides an in position signal indicating that the print drum 1004 is in a proper position for the hammers 1010 to strike. A continuous roll of paper 1012 is advanced between the hammers 1010, drum 1004, and associated ribbon 1005 to receive a printed character impression when a hammer 1010 strikes the paper, ribbon, and drum. Other equipment conventionally associated with a line printer such as inking equipment, paper control equipment and drum rotation control equipment are well known in the art and may be assumed part of the line printer 1002 though not explicitly shown for simplicity. An input channel such as IW-4 902 (FIG. 9) is connected to receive parallel data T0–T8 from the pickoff 1008 and communicate this data to the data processor 112. A print hammer select register 808 (FIG. 8) is serially connected to receive data from the data processor 112 and is connected in parallel to the hammer assembly 1006 with signals $C_6Q$–$C_{15}Q$ (FIG. 8). The data processor 112 is also connected directly to the hammer assembly 1006 via discrete output channel DO-O. Each hammer 1010 is connected to respond DO-0. a different bit position of a print hammer decoded word in the print hammer select register 808. Whenever the data processor 112 provides a discrete output DO-0, all of the hammers 1010 corresponding to a bit position containing a one in the print hammer select register 808 are activated, each causing a character to appear on the paper 1012 as a result.

In a preferred embodiment of this invention, the data processor is responsive to the encoder pickoff signals and generates the hammer select signals under program control. The encoder pickoff signals may be interrogated by the data processor such as with input signals shown in FIG. 9 as the T0 through T8 input signals. The data processor 112 periodically samples these input signals to detect the "in position" condition of the print drum on line T8, then interrogates the print drum row character identification code, which are signals T0 through T7. The data processor then fetches a print hammer decoded word indicating all of the column positions to be printed with that character from memory and outputs the print hammer decoded word to the print hammer select register 808 which may be a register which is shown in FIG. 8 (FIG. 13 of the parent application Ser. No. 101,881) as the C register with the $C_6$ through $C_{15}$ hammer select bits for a ten hammer or ten column printer. This register may be extended, as illustrated in FIG. 15A of said parent application Ser. No. 101,881 to control the required number of print hammers.

A program flow diagram is shown in FIG. 7C to illustrate one embodiment of the printer control operation. The real time executive routine, previously described in conjunction with FIG. 3, will provide entry to a printer output subroutine along path 309. The data processor will decode the line of characters to be printed into a set of hammer select words in operation 760. Each word will correspond to a particular character, containing a logical one hammer select bit for each position in the line to be printed that contains that particular character. Typically, each hammer will be selected once per printed line (except for space characters) and only once per line. In this embodiment, the general purpose nature of the data processor is extended to the system level, where complex symbols or characters can be printed by selecting a hammer more than once per line; thereby building up a complex character.

For a 76 character printer, there will usually be at least 76 rows 1018 on the print drum 1004. Also, there will usually be one hammer select word for each row 1018 on the print drum 1004.

The data processor will test the row in-position condition T8 in operation 762. If the row is not in position, the data processor will branch along path 764 and exit the subroutine along path 312 as previously described. If the row is in position, the data processor will branch along path 766 to operation 768; where the data processor will input the encoder parameter (T0 through T7), access the appropriate hammer select word from memory, then output the hammer select word to register 808 to select the appropriate hammers for the corresponding character row. The data processor will then generate the print strobe in operation 780 with a discrete output pulse DO-0 and exit the subroutine along path 312 as previously discussed.

Although the preferred embodiment of the printer is an elemental drum printer, it will become obvious to those skilled in the art that an elemental chain printer or other printer device could be used. Also, the print strobe is shown generated by the computer, but can be generated in other ways such as with the T8 signal directly from pickoff 1008.

Operation

The operation of a numerical control system, implemented with one embodiment of this invention, is described in the previously referenced parent application Ser. No. 101,881. To further illustrate the broad applicability of the teachings of this invention, the operation of business systems will be discussed hereafter. In particular, a small payroll system and a small calculator system will be discussed. The payroll system uses a keyboard input and a printer output. The calculator system uses a keyboard input and a display output. The subsystems for providing these capabilities are described in detail in the previously referenced parent application Ser. No. 101,881. The preferred embodiment of the payroll and calculator systems are as factored computer systems with elemental extremities and with the read only memory main memory 130 as discussed in the referenced parent application Ser. No. 101,881.

Business operations may use the operator panel controls such as the selector switches and momentary switches. The control panel 114 permits convenient addition of switches as described in the previously referenced parent application Ser. No. 101,881, particularly page 19 lines 24 through 28, page 29 lines 1 through 17, and other descriptions therein. The lamp and numeric displays 118 inform the operator of the system conditions.

The keyboard position 284 of the mode selector switch 240 permits operator control of the data processor operations through the keyboard 244. Commands can be entered through the keyboard 244, then executed by the data processor when the cycle start switch 246 is depressed. When commands are loaded through the keyboard 244, the commands will automatically be displayed on the numeric displays 238 by the data processor 112 under program control. Data input errors can be easily corrected by the operator depressing the clear switch 250, causing the data processor to clear the display 118 and the incorrect information and then reenter the parameter through the keyboard 244.

For operator convenience, the momentary switches are grouped into functional arrays such as with the keyboard switches 244. The keyboard 244 is composed of ten numeric keys defined as 0 through 9 and a negative sign key. The zero key commands the data processor to load a plus sign. The numeric and sign keys of the keyboard 244 are used to command the data processor to enter a parameter in the keyboard mode. A clear key 250 adjacent to the keyboard 244 is used to command the data processor to blank the numeric displays 238 prior to the operator entering data. An enter key 254 is used to command the data processor to store a parameter after the parameter has been entered through the keyboard 244 and verified by the operator's observation of the numeric display 238. In the keyboard mode, the various parameters can be varied or entered as required. Parameter verification is achieved by rotating the parameter selector switch 242 to the appropriate position to command the data processor to display the appropriate parameter, then monitoring the numeric display 238. Parameter modification is accomplished by depressing the clear key 250, resulting in the data processor blanking the numeric display 238, and the sequential depression of the sign and numeric keys of the keyboard 244, resulting in the data processor loading the parameter and displaying the parameter on the numeric display 238.

The control switches of the control panel are not hardwired directly into the control panel lamps 233 and other system functions. Instead, the data processor periodically samples the status of the various switches under program control, then further acts under program control to operate the various extremities of the system in accordance with the status of the control switches. Because the switches are sampled in this way as opposed to being hardwired, the data processing system 110 can be used for different but related applications by merely providing different extremities, changing the designations associated with the various switches, and changing the program which interprets the various switch positions and causes the system to react accordingly. In addition, existing switches can be easily deleted and spare capacity permits the addition of extra momentary switches, extra selector switches and even additional positions on existing selector switches.

One of the modes of operation provides typewriter inputs such as with a Teletype Model ASR-33, connected to the system as described previously for communication between the operator and the system. Various letter symbols typed by the operator may be used as commands to the data processor. Numbers preceeding or following a letter command further define the command parameters.

Still another means for providing data and commands is over a data link 150 such as communicating with a remote computer system 160. This remote computer system may be a time share system, a remote batch processing system, or other computer system such as the system 360 manufactured by International Business Machines and the Model 1108 manufactured by Univac.

Data and commands can be obtained from many sources to select the modes of operation and the sources of data and commands. These various sources will become obvious to those skilled in the art.

When the keyboard 244 is enabled such as when the mode selector switch 240 is in the keyboard position 284, the operator can enter parameters through the keyboard 244. These parameters are accepted by the data processor 112 for processing and used by the data processor 112 to display the parameter on the numeric display 238 for operator cognizance and parameter varification. For example, the operator may wish to use the parameter +05.6000 for a computation. To do this he enables the keyboard 244, such as by positioning the mode selector switch 240 to the keyboard position 284, then selects the parameter, such as by positioning the parameter selector switch 242 to the appropriate position, and then enters the parameter +05.6000 through the keyboard 244. The data processor 112 causes the numeric display 238 to display each character in response to the depression of each key of the keyboard until the complete parameter, +05.6000, is displayed. The data processor is then ready to execute the command, such as with the depression of the cycle start switch 246.

The operation of the payroll system will now be discussed. The payroll system comprises the data processor 112 with a keyboard input and printer output. The data processor 112 obtains stored program instructions from main memory 130 and can obtain payroll data from the main memory 130 if it is a core memory, from a scratch pad memory, or from an auxiliary memory 152. The operator can use the keyboard 244 on the control panel 114 or the keyboard on the typewriter 156 for data and command inputs. The data processor 112 will print out the paycheck and record keeping data on the printer such as on the typewriter 156.

The data processor 112 is responsive to the keyboard inputs which may be in the form of rudimentary signal forms such as with switch bounce characteristics. The data processor 112 will process these switch inputs as described hereafter to derive the desired digital data, then process this data to derive the required paycheck parameters. The paycheck parameters are printed out on the paycheck forms with the typewriter 156. Error checking and correction methods can be used with this system. Various well known devices can be substituted for those described, such as the substitution of an auxiliary memory 152 to provide storage for the input data for use at a future time or a data link 150 to a remote computer center 160 for further processing of the input data in place of the further processing in the dedicated system and the immediate printout with the output typewriter 156.

The operation of the calculator system will now be discussed. The calculator system comprises the data processor 112 with a keyboard 244 input and a numeric display 238 output. The data processor 112 obtains stored program instructions from the main memory 130, which is an integrated circuit read only memory in the preferred embodiment, and can obtain calculation data and commands from the keyboard 244 on the control panel 114. The data processor will display the calculator problem solutions with the numeric display 238 on the display panel 118.

The data processor 112 is responsive to the keyboard inputs which may be in the form of rudimentary signal forms such as with switch bounce characteristics. The data processor 112 will process these switch inputs to derive the desired digital data, then process this data to derive the required computational solutions. These solutions are displayed on the numeric display 238.

When the operator depresses a switch, the data processor 112 will sense this switch condition, perform various timing and logic operations to eliminate switch bounce, decode the switch input to derive the character or command, then display the desired results on the numeric display 238. If the depressed switch is part of the keyboard 244, then the data processor will display that character for various purposes such as for verification by the operator that the correct character was loaded into the data processor. As the operator depresses keyboard switches, the parameter will build up on the display, character by character, until the complete parameter desired by the operator has been built up and is displayed. If an error exists such as from depression of the wrong switch, the operator can correct the error by keying in the correct parameter, which may require the operator to first clear the parameter with the clear switch 250. When the desired parameter has been entered and correctly displayed, the operator can depress a command switch, such as the cycle start switch 246 for the numerical control system or as add switch 283, subtract switch 285, multiply switch 287, or divide switch 289 for the calculator system. After the computational solution has been generated, the data processor 112 will display the solution on the numeric display 238. The data processor can be used to refresh this numeric display 238 under stored program control as described previously.

A stored program data processor is typically lower in speed than special purpose devices, where the data processor is usually sequential in operation and the special purpose devices are simultaneous in operation. The stored program data processor performs sequential micro operations to execute instructions, executes sequential instructions to perform program routines, and performs sequential program routines to provide the data processor tasks. The special purpose devices provide special purpose logic for most operations, where this logic operates simultaneously to perform the various tasks simultaneously. A stored program data processor of the type described for a factored computer in referenced parent application Ser. No. 101,881 is typically slower than the usual stand-alone mainframe data processors such as mini-computers because of the low cost and dedicated system operation requirements. Therefore, system operation would be different in many respects from the prior art hardwired operations that would not have such a speed constraint. One example is with the numeric display, where performance of the numeric refresh operation by the data processor under program control might be performed only while the data processor is "idling" such as during a period of low computational load, but is not performed during a period of high computational load.

As an example of one of these idle operations, the calculator described can be programmed to display the parameters when awaiting operator action. When the operator depresses a command switch such as the multiply command switch 287, data processor 112 enters a period of high computational load to derive the multiplication solution and may therefore discontinue the refresh operations. At the completion of this computation, the data processor will again enter an idle period or a period of low computational load and can resume the numeric refresh operations, typically displaying the computational solution.

When the refresh operations are discontinued, the last character commanded will remain illuminated, thereby providing a single, bright character display in place of the complete parameter display. This is esthetically displeasing and may cause degradation of the brightly illuminated character due to the increased duty cycle for that character. Therefore, the data procesor can be programmed to blank the display prior to entering a period of high computational load; such as with a display command of all zeros, thereby selecting all segments of the display to be extinguished.

As another example of idle operations, the data processor can be programmed to respond to all controls during an idle period, but respond only to selected controls or to no controls during the period of high computational load. For example, depression of a keyboard switch during the multiply operation will not provide a response if the program does not provide for the sampling of keyboard switch input signals while a multiply operation is being executed.

Various well known devices can be substituted for those described in the calculator system. For instance, a typewriter 156 or known printer can be substituted for the numeric displays 238.

A detailed description of the data processor of the present invention including a description of micro-operations, initialization, discrete outputs, discrete inputs, interrupts, data-save, adaptive memory control; memory protect, instruction repertoire, and other descriptions are set forth in parent application Ser. No. 101,881 which descriptions are herein incorporated by reference. The micro-operation flow diagram shown in FIG. 11 defines operation of data processor 112 and finds extensive descriptions in parent application Ser. No. 101,881 which descriptions as-amended are herein incorporated by reference.

Other Considerations

The versatility of the control panel 114 and display panel 118 are presented in the previously referenced applications; Data Processing System and Interactive Control System. This versatility permits the lamp displays 218, the momentary switches, and the selector switches to be assigned various selected functions, as described previously.

The input-output structure of the system 110 generally shown in FIGS. 8 and 9 is described in greater detail in the parent application, Data Processing System.

When operating under program control, the data processor 112 stores various condition bits, flags, words, or various combinations of these digital signals such as S2, S3, K, N, and M described herein. These digital signals are stored, fetched, tested and modified using the packing and unpacking operations described herein or using other well known programming techniques.

It is thus clearly seen that the present invention provides a novel means and method of providing a system for business data processing.

From the above description it will be apparent that there is thus provided a device of the character described possessing the particular features of advantage before enumerated as desirable, but which obviously is susceptible to modification in its form, proportions, operation, detail implementation and arrangement of parts without departing from the principle involved or sacrificing any of its advantages.

While in order to comply with the statute, the invention has been described in language more or less specific as to structural features, it is to be understood that the invention is not limited to the specific features shown, but that the means and construction herein disclosed comprise the preferred form of several modes of putting the invention into effect and the invention is, therefore, claimed in any of its forms or modifications within the legitimate and valid scope of the appended claims.

What is claimed is:

1. An operator control system comprising:
   a switch for generating a switch signal having a switch bounce signal portion and a switch information signal portion;
   a command memory for storing commands related to processing of the switch signal;
   an information memory for storing processed information related to the switch information signal portion; and
   processing means for processing information in respone to said stored commands; said processing means including means for receiving the switch signal, means for processing the received switch signal under control of said stored commands to separate the switch information signal portion from the switch bounce signal portion, and storing means for storing information related to said separated switch information signal portion in said information memory in response to the processing of said received switch signal by said received switch signal processing means.

2. The system as set forth in claim 1 above further comprising a stored program data processor for processing information in response to stored instructions; wherein said command memory is a data processor main memory and wherein said stored commands are data processor instructions.

3. The system as set forth in claim 2 above, wherein said switch is uncommitted to system operations, and wherein said data processor is programmable for interpreting the switch signal.

4. The system as set forth in claim 1 above, further comprising display means for displaying information, said display means including a plurality of refreshable dislay elements, means for selecting a display element, and means for displaying a desired character with the selected display element; wherein said commands stored in said command memory are further related to refreshing said display elements and wherein processed information stored in said information memory is further related to information to be displayed; said processing means further including means responsive to the commands stored in said command memory and the display information stored in said information memory for sequentially selecting each of said display elements to display a desired character with each selected display element.

5. The system as set forth in claim 1 above, wherein said command memory includes an integrated circuit read only memory for storing the commands in read only form and wherein said information memory includes an integrated circuit alterable memory for storing the processed information in alterable signal form.

6. A data processing system comprising:
   switch means for generating at least one input signal having an input information signal portion and having a switch bounce signal portion degrading the input information signal portion and
   data processor means for processing information in respone to stored instructions, said data processor means including
   (1) an integrated circuit memory for storing a plurality of instructions, and
   (2) processing means connected to said integrated circuit memory and operating in response to said stored instructions for processing the input signal from said switch means to derive input information from the input information signal portion in the presence of degradation of the input information signal portion by the switch bounce signal portion.

7. A switch control system having a switch for generating a switch input signal, wherein said switch has a switch bounce characteristic and wherein said switch input signal has switch information content and switch bounce content; the improvement comprising a stored program computer for generating a switch information signal related to the switch information content of the switch input signal under program control, said stored program computer including:
   memory means for storing a program;
   processing means connected to said switch and memory means for removing the switch bounce content of the switch input signal to generate the switch information signal related to the switch information content of the switch input signal under control of the stored program; and
   storing means for storing the switch information signal.

8. The system as set forth in claim 7 above, wherein said storing means includes means for storing the switch information signal in discrete signal form.

9. The system as set forth in claim 7 above, wherein said switch is a mechanical switch.

10. The system as set forth in claim 7 above, further comprising means for operator actuation of said switch.

11. The system as set forth in claim 7 above, wherein said memory means includes an integrated circuit read only memory for storing the program in read only form.

12. The system as set forth in claim 11 above, wherein said storing means includes an integrated circuit alterable memory for storing the switch information signal in alterable form.

13. The system as set forth in claim 12 above, wherein said stored program computer is a monolithic computer implemented with integrated circuits.

14. A switch control system including a switch for generating a switch signal having an information signal portion and having a switch bounce signal portion and including a signal processor for removing the switch bounce signal portion to obtain the information contained in the information signal portion, the improvement being a computerized signal processor comprising:
   memory means for storing a plurality of computer instructions;
   switch processing means connected to said switch and said memory means for processing the switch signal to obtain switch information contained in the information signal portion by removing the switch bounce signal portion under control of the computer instructions stored in said memory means; and storing means for storing the obtained switch information in response to the processing of said switch signal by said switch processing means 15. The system as set forth in claim 14 above, wherein said memory means includes an integrated circuit read only memory for storing the instructions in read only form.

16. The system as set forth in claim 15 above, wherein said switch information signal storing means includes an integrated circuit alterable memory for storing the switch information signal.

17. The system as set forth in claim 14 above, further comprising an operator panel for mounting said switch, wherein the switch signal is generated in response to operator actuation of said switch mounted on said operator panel.

18. The system as set forth in claim 14 above, further comprising a tape reader for reading a tape with said switch, wherein the switch signal is generated in response to tape actuation of said switch.

19. The system as set forth in claim 14 above, wherein said system is a calculator system, said system further comprising:
  calculating means for calculating a solution in response to the switch information signal stored in said storing means and
  means for providing the solution to an operator in response to said calculating of a solution by said calculating means.

20. The system as set forth in claim 14 above, wherein said switch is a mechanical switch and wherein said switch bounce signal portion is generated by sequential making and breaking of switch contacts in response to actuation.

21. The system as set forth in claim 14 above, wherein said computerized signal processor is arranged as a stored program computer.

22. The system as set forth in claim 14 above, wherein said switch processing means includes means for repetitively monitoring said switch signal to identify a stable switch signal condition as the information signal portion.

23. The system as set forth in claim 14 above, further comprising:
  display processing means for generating display information under control of the computer instructions stored in said memory means in response to the switch information signal stored in said storing means and
  a display for displaying information to an operator in response to the display information generated with said display processing means.

24. The system as set forth in claim 23 above, wherein the display information includes refresh information and wherein said display includes a refreshable display for displaying refreshed information in response to the refresh information.

25. The system as set forth in claim 23 above, wherein said display includes a discrete display for displaying discrete conditions to an operator in response to the display information.

26. The system as set forth in claim 23 above, wherein said display includes a numerical display for displaying numerical information to an operator in response to the display information.

27. The system as set forth in claim 14 above, wherein said storing means includes a register for storing the switch information signal in digital word form.

28. The system as set forth in claim 14 above, wherein said storing means includes a single bit circuit for storing the switch information signal in single bit form.

29. A switch control system having a switch for generating a switch input signal, wherein said switch provides switch bounce upon actuation for an actuation period of time, wherein the switch input signal includes an unstable switch bounce signal content for the actuation period of time and a stable switch information signal content following the actuation period of time; the improvement comprising a stored program data processor for generating a switch information signal under program control, said stored program data processor including:
  memory means for storing the program;
  processing means connected to said switch and said memory means for determining occurrence of the stable switch information after said switch actuation under control of the stored program by separating said unstable switch bounce signal content from said stable switch information signal content; and
  storing means for storing said determined stable switch information in response to the occurrence determined by said processing means.

30. The system as set forth in claim 29 above, wherein said switch is a mechanical switch having mechanical contacts and wherein said switch bounce is related to alternate making of contact and breaking of contact of said mechanical contacts.

31. The system as set forth in claim 29 above, further comprising operator actuation means for actuation of said switch by an operator.

32. The system as set forth in claim 29 above, further comprising tape actuation means for actuation of said switch by a punched tape.

33. The system as set forth in claim 29 above, further comprising machine actuation means for actuation of said switch by a machine.

34. The system as set forth in claim 29 above, wherein said processing means includes means for providing a predetermined time delay to determine said occurrence of the stable switch information.

35. The system as set forth in claim 29 above, wherein said memory means includes an integrated circuit read only memory for storing the program in read only form.

36. The system as set forth in claim 35 above, wherein said storing means includes an integrated circuit alterable memory for storing the switch information signal.

37. The system as set forth in claim 36 above, wherein said stored program data processor is a monolithic data processor being implemented with at least one integrated circuit.

38. The system as set forth in claim 29 above, wherein said storing means includes a flip-flop for storing the switch input signal in single bit form.

* * * * *